(12) United States Patent
Nagumo

(10) Patent No.: US 8,704,862 B2
(45) Date of Patent: Apr. 22, 2014

(54) SEMICONDUCTOR COMPOSITE DEVICE, METHOD OF MANUFACTURING THE SAME, OPTICAL PRINT HEAD AND IMAGE FORMING APPARATUS

(75) Inventor: Akira Nagumo, Tokyo (JP)

(73) Assignee: Oki Data Corporation, Tokyo (JP)

( * ) Notice: Subject to any disclaimer, the term of this patent is extended or adjusted under 35 U.S.C. 154(b) by 871 days.

(21) Appl. No.: 12/873,445

(22) Filed: Sep. 1, 2010

(65) Prior Publication Data

US 2011/0050838 A1 Mar. 3, 2011

(30) Foreign Application Priority Data

Sep. 2, 2009 (JP) ................................. 2009-202379

(51) Int. Cl.
*B41J 2/45* (2006.01)
(52) U.S. Cl.
USPC .......................................................... 347/238
(58) Field of Classification Search
USPC ......................................... 347/133, 238, 239
See application file for complete search history.

(56) References Cited

U.S. PATENT DOCUMENTS

| 7,923,737 B2 * | 4/2011 | Nagumo | 257/88 |
| 2007/0057259 A1 * | 3/2007 | Nagumo | 257/67 |

FOREIGN PATENT DOCUMENTS

JP 2007-081081 A 3/2007

\* cited by examiner

*Primary Examiner* — Huan Tran
(74) *Attorney, Agent, or Firm* — Marvin A. Motsenbocker; Mots Law, PLLC

(57) ABSTRACT

A method of manufacturing a semiconductor composite device, including steps of: preparing a substrate comprising circuit elements, which are part of a driving circuit; attaching an array of driven elements onto the substrate via a passivation layer, the array being formed of a semiconductor thin film having a crystal structure wherein the driven elements are arrayed to be driven by the driving circuit; and forming a metal wire by a photo-lithography method such that the circuit elements are electrically connected with the metal wire to form the driving circuit and the driving circuit is electrically connected to the driven elements with the metal wire.

20 Claims, 20 Drawing Sheets

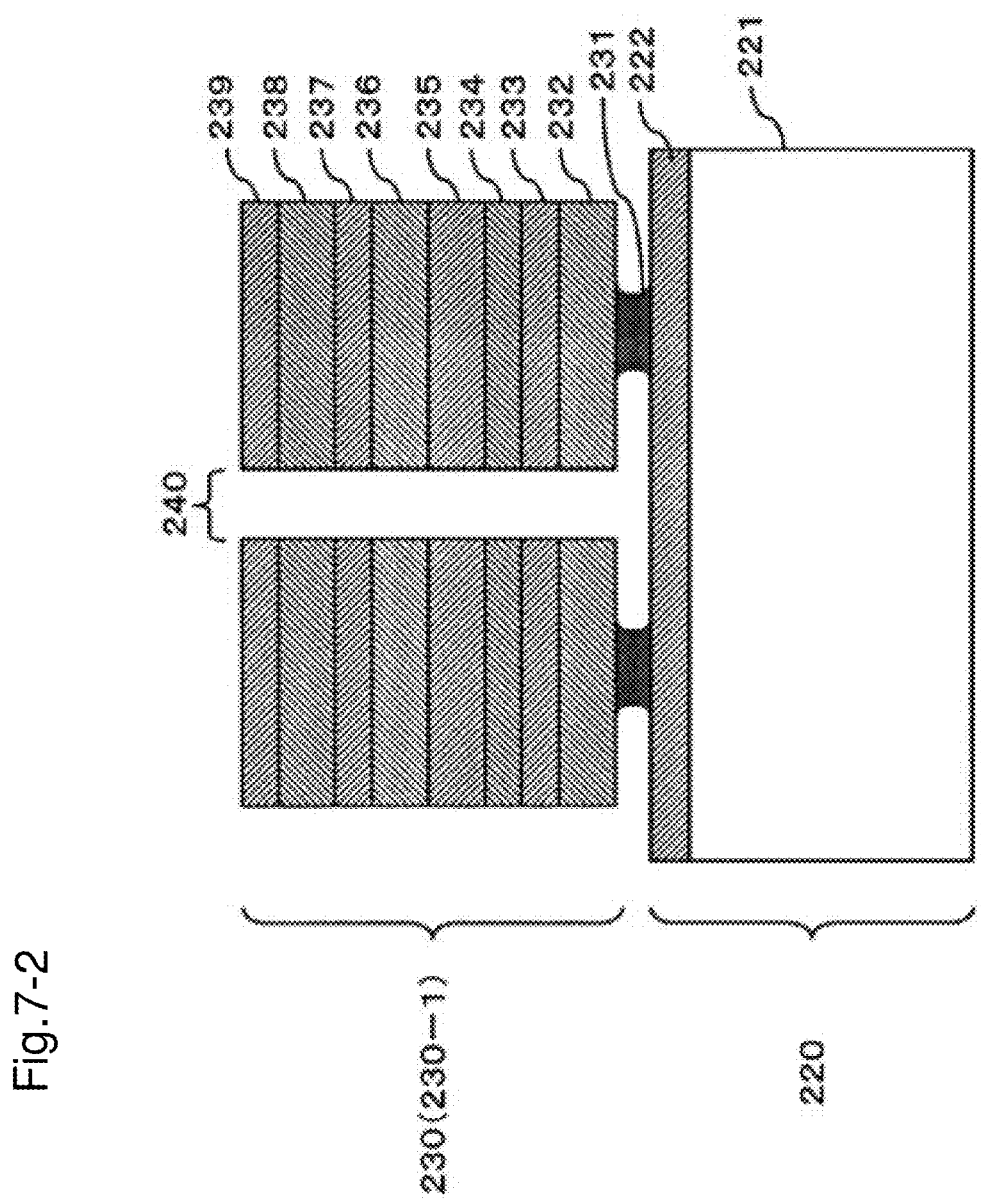

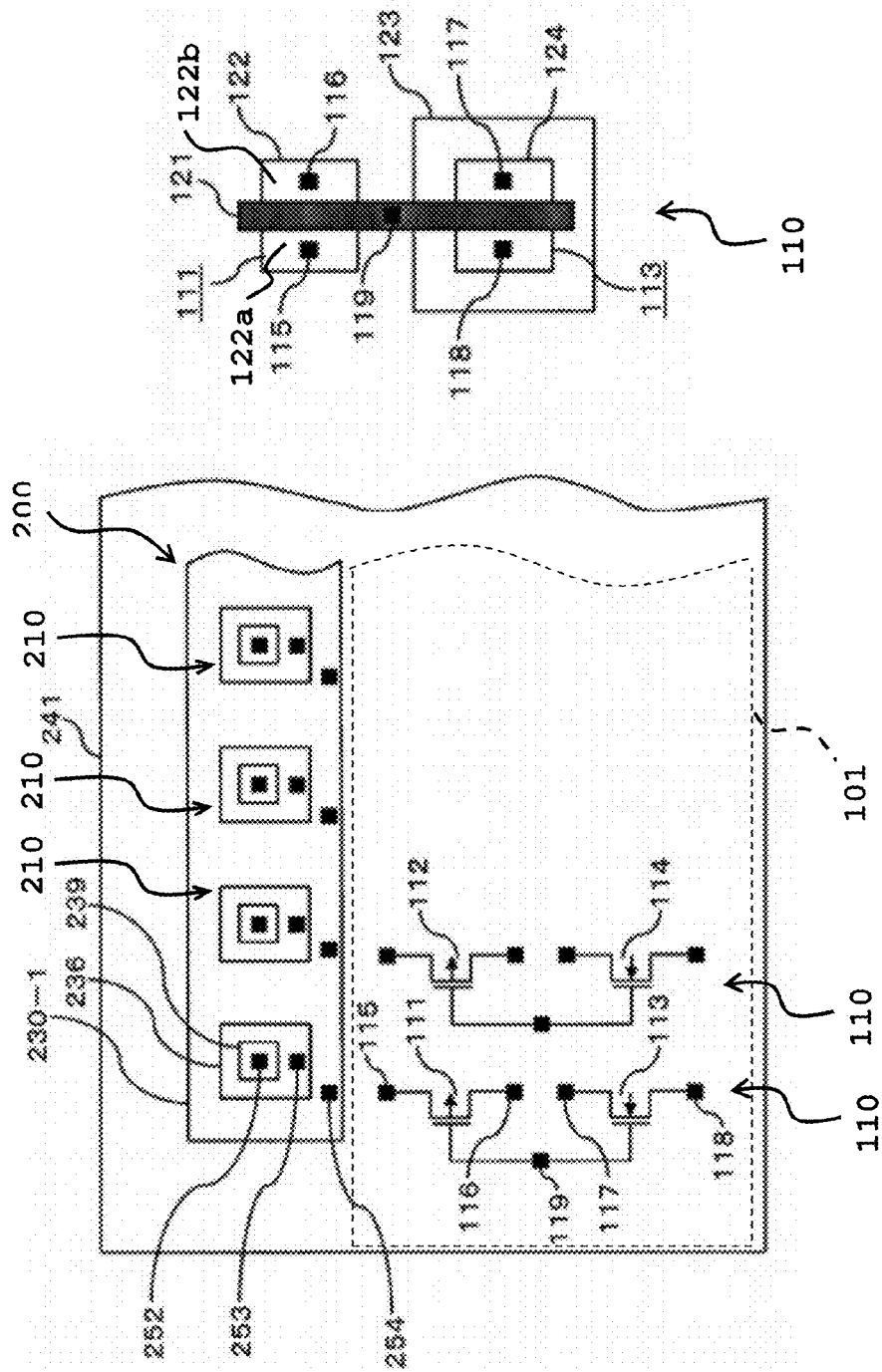

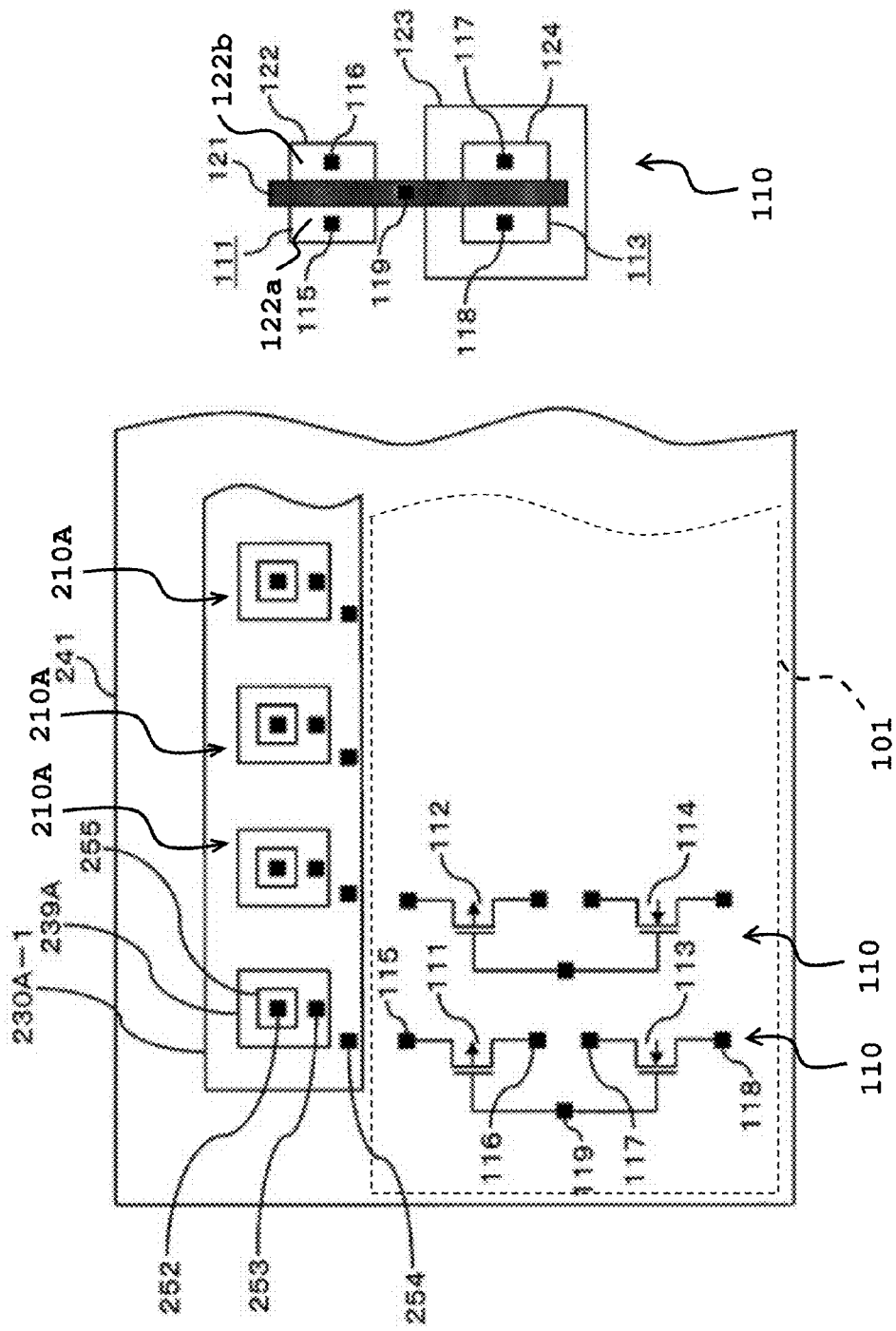

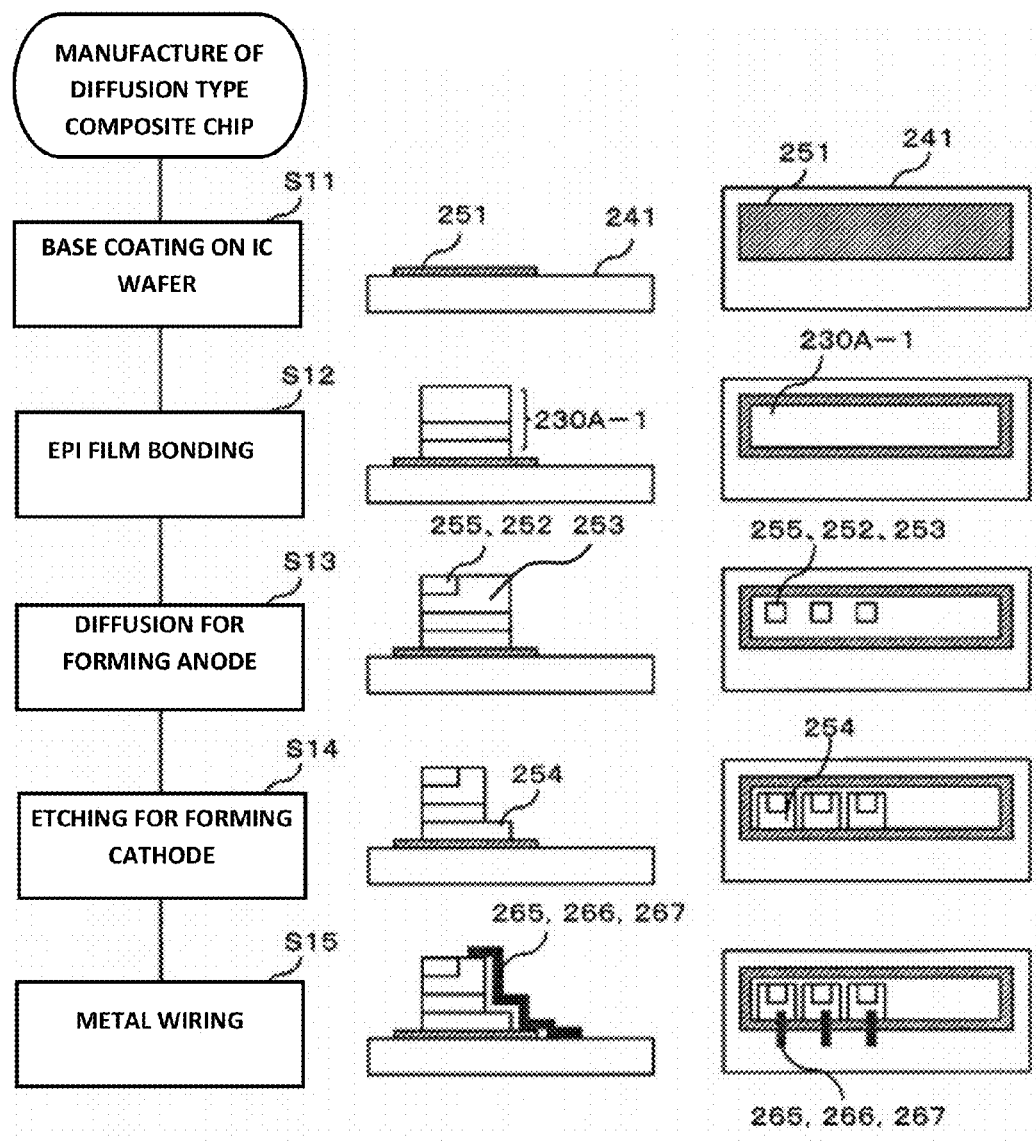

SEMICONDUCTOR COMPOSITE DEVICE, METHOD OF MANUFACTURING THE SAME, OPTICAL PRINT HEAD AND IMAGE FORMING APPARATUS

CROSS REFERENCE TO RELATED APPLICATIONS

This application claims priority based on 35 USC 119 from prior Japanese Patent Application No. P2009-202379 filed on Sep. 2, 2009, entitled "Semiconductor Composite Device, Method of Manufacturing the Same, Optical print head and Image Forming Apparatus", the entire contents of which are incorporated herein by reference.

BACKGROUND OF THE INVENTION

1. Field of the Invention

The invention relates to a semiconductor composite device including a driven element such as a light-emitting thyristor and a driving circuit configured to drive the driven element, a method of manufacturing the semiconductor composite device, an optical print head including the semiconductor composite device, and an image forming apparatus such as an electrophotographic printer including the optical print head.

2. Description of Related Art

There has been known a conventional image forming apparatus such as an electrophotographic printer including an exposure device wherein plural light-emitting elements are arrayed. A light-emitting diode (hereinafter, referred to as a "LED"), an organic electroluminescence (hereinafter, referred to as an "organic EL"), a light-emitting thyristor, or the like is used as the light-emitting element.

In an art using a light-emitting thyristor, a driving circuit and the light-emitting thyristor(s) are provided in one-to-one or one-to-N (N<1). The light-emitting thyristor is controlled to be on or off, by switching on or off a driving current between the anode terminal (hereinafter, simply referred to as an anode) and the cathode terminal (hereinafter, simply referred to as a cathode) of the light-emitting thyristor. The emission energy (illumination intensity) of the light-emitting thyristor is determined by the value of the driving current. That is, the energy of light exposed from an exposure device having the light-emitting thyristors to a photosensitive drum is determined by the value of the driving current.

Since the light-emitting thyristor is generally formed of a compound semiconductor, it is inevitable that the illumination intensity of the light-emitting thyristors varies due to crystal defects in the compound semiconductor. Accordingly, non-uniform print density may occur in an image forming apparatus using the light-emitting thyristors made of the compound semiconductors. To solve this problem, there has been known a related art wherein an illumination intensity correction is executed by separately controlling the value of a driving current for each of light-emitting thyristors.

Japanese Patent Application Laid-Open No. 2007-81081 discloses a manufacturing method of a semiconductor composite device. In the manufacturing method, an epitaxial film (hereinafter, referred to as an "epi film") is used. The epi film is formed by providing an epitaxial layer on a GaAs base member, forming a light-emitting thyristor within the epitaxial layer, and delaminating the epitaxial layer from the GaAs wafer base member to obtain a film as the epi film. The epi film is attached on a silicon wafer in which a driving circuit is formed. Then, the light-emitting thyristor and the driving circuit are electrically connected to each other with thin film wires. With this process, a semiconductor composite device in which the light-emitting thyristor and the driving circuit are integrated is obtained.

However, the conventional semiconductor composite device and the manufacturing method have the following problems (a) and (b).

(a) The semiconductor composite device is manufactured by: forming first metal wires by a photo-lithography method to electrically connect circuit elements of the driving circuit which were previously formed in the silicon wafer; attaching the epi film having therein the light-emitting thyristors onto the silicon wafer; and then forming second metal wires to electrically connect output terminals of the driving circuit to gates of the light-emitting thyristors. Accordingly, the two metal wire wiring steps are needed to manufacture the semiconductor composite device, and this increases the manufacturing cost.

(b) Since the first metal wires for the driving circuit are thin films mainly made of aluminum, which does not have high heat-resistance, it is difficult to execute a high-temperature process such as an impurity diffusion process after the epi-file is attached on the wafer.

SUMMARY OF THE INVENTION

A first aspect of the invention is a semiconductor composite device including: a substrate comprising circuit elements, which are part of a driving circuit; an insulating film provided on the substrate; a driven element array provided on the insulating film on the substrate, the driven element array being formed of a semiconductor thin film having a crystal structure wherein driven elements for example, light-emitting elements) configured to be driven by the driving circuit are arrayed; and a wire electrically connecting the circuit elements to each other such that the wire and the circuit elements make up the driving circuit and the wire electrically connecting the driving circuit and the driven elements.

A second aspect of the invention is a semiconductor composite device including: a substrate comprising circuit elements, which are part of a driving circuit; an insulating film provided on the substrate; a driven element array provided on the insulating film on the substrate, the driven element array being formed of a semiconductor thin film having a crystal structure wherein driven elements (for example, light-emitting elements) configured to be driven by the driving circuit are arrayed; an impurity diffusion region in the semiconductor thin film, the impurity diffusion region being a part of the driven element; and a wire electrically connecting the circuit elements to each other such that the wire and the circuit elements form the driving circuit and the wire electrically connecting the driving circuit and the driven elements.

A third aspect of the invention is a method of manufacturing a semiconductor composite device comprising steps of: preparing a substrate comprising circuit elements, which are part of a driving circuit; attaching a semiconductor thin film on the substrate via a passivation layer, the semiconductor thin film having a crystal structure forming the driven element array wherein driven elements configured to be driven by the driving circuit are arrayed; and forming a metal wire by a photo-lithography method such that the circuit elements are electrically connected with the metal wire to form the driving circuit and the driving circuit is electrically connected to the driven elements with the metal wire.

A fourth aspect of the invention is a method of manufacturing a semiconductor composite device including steps of: preparing a substrate comprising circuit elements, which are part of a driving circuit; attaching a semiconductor thin film on the substrate via a passivation layer, the semiconductor thin film having a crystal structure forming a driven element array wherein driven elements configured to be driven by the driving circuit are arrayed; forming an impurity diffusion region in the semiconductor thin film by diffusing an impurity into the semiconductor thin film, the impurity diffusion region being a part of the driven element; and forming a metal wire by a photo-lithography method such that the circuit elements are electrically connected with the metal wire to form the driving circuit and the driving circuit is electrically connected to the driven elements with the metal wire.

A fifth aspect of the invention is an optical print head including: the semiconductor composite device according to the first aspect or the second aspect; and a lens array configured to refract light emitted from the light-emitting elements of the semiconductor composite device.

A sixth aspect of the invention is an image forming apparatus including the optical print head according to the fifth aspect.

According to the semiconductor composite device of the first aspect and the method of manufacturing the same of the third aspect, the step of electrically connecting the circuit elements, which are part of the driving circuit, to each other and the step of electrically connecting the driven element array and the driving circuit can be performed at the same time. This simplifies the manufacturing method of the semiconductor composite device and thus greatly reduces the manufacturing cost.

According to the semiconductor composite device of the second aspect and the method of manufacturing the same of the fourth aspect, the same effects as the first and third aspects can be achieved.

According to the fourth aspect, after the semiconductor thin film having therein the driven element array is attached onto the substrate, the impurity diffusion region, which is a part of the driven elements, is formed by diffusing the impurity into the semiconductor thin film. Thus, the fourth aspect can increase the density of the impurity, thereby improving the performance of the driven element.

Further, according to the fourth aspect, the position of the impurity diffusion region can be easily set. This improves the location accuracy of the impurity diffusion region and also reduces the size of the impurity diffusion region.

According to the optical print head of the fifth aspect, the array pitch of the driven elements can be shortened. This realizes a precision miniature optical print head.

According to the sixth aspect, the space efficiency and the light emission efficiency of the image forming apparatus can be improved, thereby realizing a high-quality image forming apparatus.

BRIEF DESCRIPTION OF THE DRAWINGS

FIG. 7-1 is an outline sectional view illustrating a method of manufacturing epi film 230-1 for light-emitting thyristor 210 of a mesa-type shown in FIG. 6.

FIG. 7-2 is an outline sectional view illustrating the method of manufacturing epi film 230-1.

FIG. 7-3 is an outline sectional view for explaining a method of manufacturing the semiconductor composite device according to the first embodiment.

FIGS. 7-4A and 7-4B are outline plan views for explaining the method of manufacturing the semiconductor composite device according to the first embodiment.

FIG. 12-1 is an outline sectional view illustrating a method of manufacturing epi film 230A-1 for light-emitting thyristor 210A of a diffusion type according to the second embodiment.

FIG. 12-2 is an outline sectional view illustrating the method of manufacturing epi film 230A-1.

FIG. 12-3 is an outline sectional view for explaining a method of manufacturing a semiconductor composite device according to the second embodiment.

FIGS. 12-4A and 12-4B are outline plan views for explaining the method of manufacturing the semiconductor composite device according to the second embodiment.

FIGS. 14A to 14C illustrate an outline of the process of manufacturing the semiconductor composite device of the diffusion type according to the second embodiment.

DETAILED DESCRIPTION OF EMBODIMENTS

Figure 1:
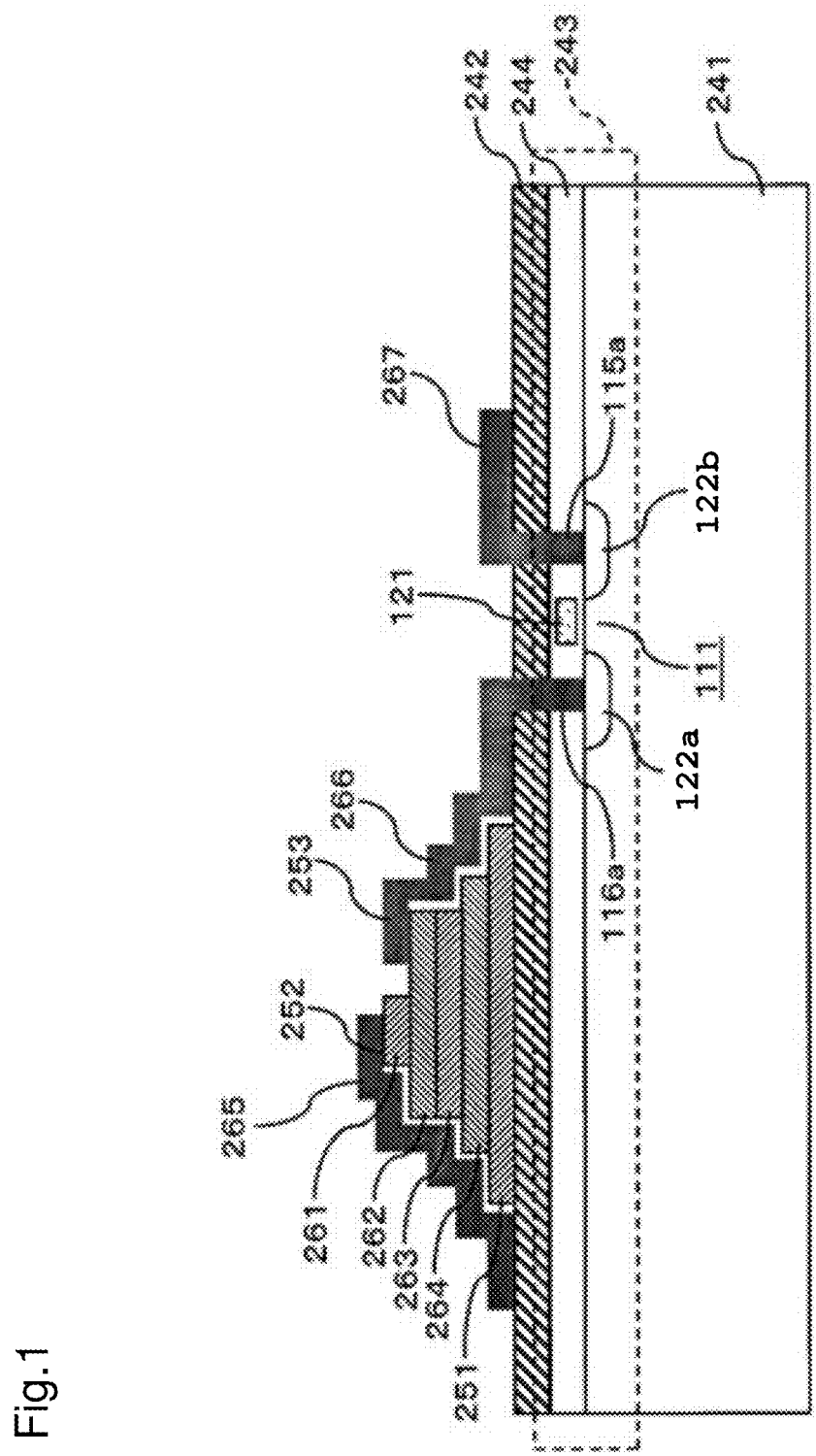
FIG. 1 is an outline sectional view illustrating a wiring structure of a semiconductor composite device according to a first embodiment of the invention.

Descriptions are provided hereinbelow for embodiments based on the drawings. In the respective drawings referenced herein, the same constituents are designated by the same reference numerals and duplicate explanation concerning the same constituents is omitted. All of the drawings are provided to illustrate the respective examples only.

First Embodiment

Image Forming Apparatus of First Embodiment

Figure 2:
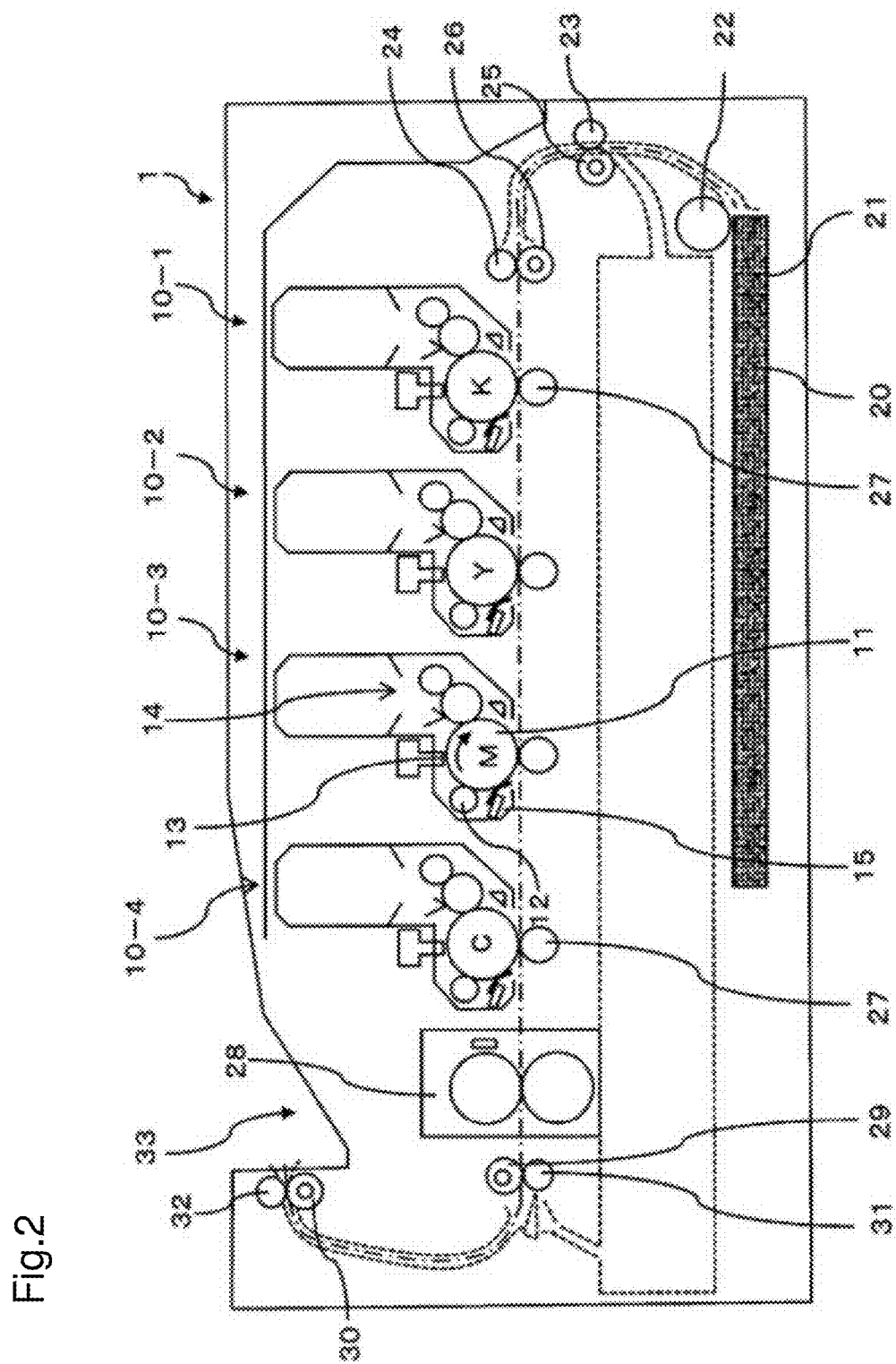
FIG. 2 is a configuration diagram of image forming apparatus 1 of the first embodiment.

FIG. 2 is an outline configuration diagram of an image forming apparatus according to the first embodiment of the invention.

Image forming apparatus 1 is an electrophotographic color printer including optical print heads 13. Each optical print head 13 is equipped with semiconductor composite devices. Each of the semiconductor composite devices includes light-emitting elements (for example, light-emitting thyristors formed of three terminal switching elements) serving as driven elements and a driving circuits) for driving the light-emitting elements. Image forming apparatus 1 includes four process units 10-1 to 10-4 that respectively form images in black (K), yellow (Y), magenta (M), and cyan (C), and are arranged in this order from the upstream to the downstream of the conveyance path of recording medium 20 (for example, a paper sheet). Since the interior configurations of process units 10-1 to 10-4 are the same, the interior configuration of process unit 10-3 of color magenta is described as an example.

Process unit 10-3 has photosensitive drum 11, serving as an image carrier, which is rotatable in the direction of the arrow in FIG. 2. Provided around photosensitive drum 11 in the order from upstream of the rotating direction are: charging device 12 which supplies electric charges to the surface of photosensitive drum 11 to charge the surface; and exposure device (for example, optical print head) 13 which forms an electrostatic latent image by selectively emitting light to the surface of charged photosensitive drum 11. Moreover, there are provided: developing device 14 which generates a visual toner image by attaching magenta toner (a predetermined-color toner) to the electrostatic latent image formed on the surface of photosensitive drum 11; and cleaning device 15 which removes toner remaining after transfer of the visible toner image from photosensitive drum 11 to paper sheet 20. The drums and rollers which are used in these devices are rotated by a driving force transmitted from an unillustrated driving source via gears or the like.

Sheet cassette 21 used to store therein a stack of paper sheets 20 is set in the lower portion of image forming apparatus 1. Disposed above sheet cassette 21 is feed roller 22 that withdraws paper sheets 20 one by one into the conveyance path. Pinch rollers 23 and 24, conveying roller 25, and registration roller 26 are disposed downstream of feed roller 22 in the conveying direction of paper sheet 20. Paper sheet 20 is conveyed by and between pinch roller 23 and conveying roller 25 and further conveyed by and between pinch roller 24 and registration roller 26 toward process units 10-1 to 10-4 while rollers 24 and 26 correct the orientation of each paper sheet P to correct for any skew of paper sheet P. Feed roller 22, conveying roller 25 and registration roller 26 are rotated by a driving force transmitted from an unillustrated driving source via gears or the like.

Image transfer device 27 (transfer roller) made of a material such as a semi-conductive rubber is disposed opposed to photosensitive drum 11 of each of process units 10-1 to 10-4. A voltage is applied to each image transfer device 27 to produce a predetermined potential difference between the surface of photoreceptor drums 11 and the surface of image transfer device 27, in order to attract the visualized toner images from photosensitive drums 11 to paper sheet 20.

Fixing unit 28 is provided downstream of process unit 10-4. Fixing unit 28 includes a back-up roller and a heated roller having therein a heater. Fixing unit 28 heats and presses the toner image on paper sheet 20 so as to fix the toner image to paper sheet 20. Provided downstream of fixing unit 28 is a discharge unit including a pair of discharge roller 29 and pinch roller 31 and a pair of discharge roller 30 and pinch roller 32, and paper stacker 33. Paper sheet 20 from fixing unit 28 is conveyed by and between discharge roller 29 and pinch roller 31 and further conveyed by and between discharge roller 30 and pinch roller 32 so as to be discharged to paper stacker 33. Fixing unit 28, discharge roller 29, and the like are rotated by a driving force transmitted from an unillustrated driving source via gears or the like.

Image forming apparatus 1 having the above configuration operates as follows.

First, paper sheet 20 stacked in sheet cassette 21 is fed one by one from the top of the stack into the conveyance path by feed roller 22. Then, paper sheet 20 is conveyed toward a position between photosensitive drum 11 and image transfer device 27 in process unit 10-1 by the pair of pinch roller 23 and conveying roller 25 and the pair of pinch roller 24 and registration roller 26. Paper sheet 20 is then sandwiched between photosensitive drum 11 and image transfer device 27 in process unit 10-1 and conveyed by the rotation of photosensitive drum 11, while the toner image is transferred from photosensitive drum 11 to the recording surface of paper sheet 20. Paper sheet 20 is then conveyed by and through process units 10-2 to 10-4 in this order. When paper sheet 20 passes through process units 10-2 to 10-4, the toner images on photosensitive drums 11 of process units 10-2 to 10-4 are, in turn, transferred and superimposed to the recording surface of paper sheet 20, thereby forming a multi-color toner image on paper sheet 20. Note that the toner image of each color is formed in each of process units 10-1 to 10-4 by formation of the electrostatic latent image by optical print head 13 and development of the electrostatic latent image by developing device 14.

After the color toner images are superimposed to the recording surface of paper sheet 20 to form the multi-color toner image, the multi-color toner image is fixed onto paper sheet 20 by fixing unit 28. Paper sheet 20 with the multi-color toner image being fixed thereon is conveyed by and between discharge rollers 29 and 30 and pinch rollers 31 and 32 to be discharged out of image forming apparatus 1 to paper stacker 33. Though the above processes, the multi-color image is formed on paper sheet 20.

(Printer Control Circuit)

Figure 3:
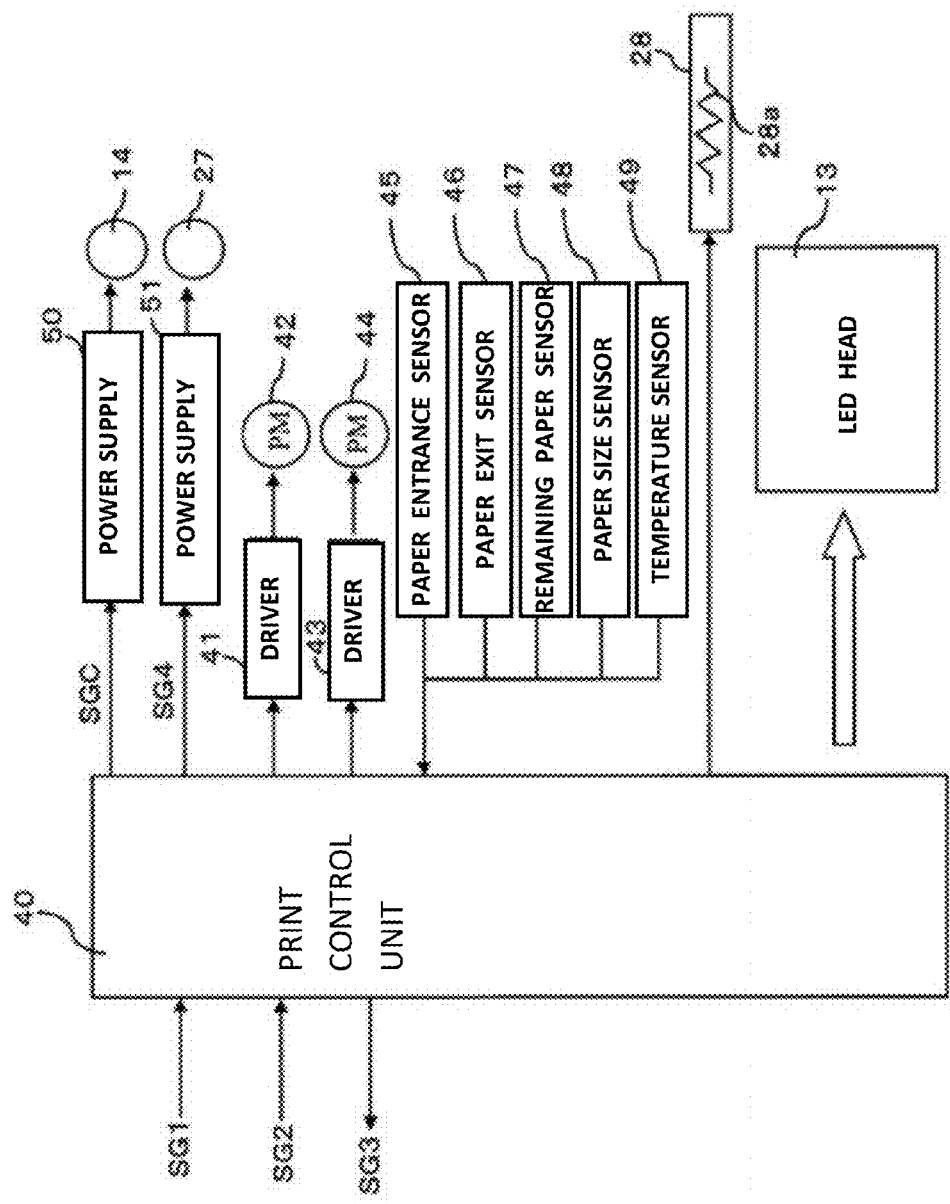
FIG. 3 is a block diagram of a printer control circuit of image forming apparatus 1 shown in FIG. 2

FIG. 3 is a block diagram of the configuration of a printer control circuit of image forming apparatus 1 in FIG. 2.

The printer control circuit includes print control unit 40 disposed inside a printing unit of image forming apparatus 1. Print control unit 40 includes a microprocessor, a ROM (Read Only Memory), a RAM (Random Access Memory), an input/output port, and a timer or the like. Print control unit 40 executes the printing operation by sequentially controlling the entire image forming apparatus in accordance with signals such as control signal SG1 and video signal (in which dot map data is one-dimensionally arranged) SG2, which are transmitted from an unillustrated image processing unit. Connected to print control unit 40 are: four optical print heads 13 of process units 10-1 to 10-4, heater 28a of fixing unit 28, drivers 41 and 43, paper entrance sensor 45, paper exit sensor 46, remaining paper sensor 47, paper size sensor 48, fixing unit temperature sensor 49, charging high-voltage power supply 50, image transfer high-voltage power supply 51, and the like. Development and transfer process motor (PM) 42 is connected to driver 41, paper conveyance motor (PM) 44 is connected to driver 43, developing device 14 is connected to charging high-voltage power supply 50, and image transfer device 27 is connected to image transfer high-voltage power supply 51.

The printer control circuit having the above configuration operates as follows. Upon receipt of a print instruction with control signal SG1 transmitted from the image processing unit, print control unit 40 detects if heater 28a of fixing unit 28 is in the range of a usable temperature, by using fixing unit temperature sensor 49. If heater 28a is not in the usable temperature range, print control unit 40 supplies power to heater 28a to heat fixing unit 28 to the usable temperature. Next, print control unit 40 instructs driver 41 to rotate development and transfer process motor (PM) 42 while turning on charging high-voltage power supply 50 to charge developing device 14 based on charge signal SGC.

After that, referring to remaining paper sensor 47 and paper size sensor 48 to detect if any paper sheets 20 are in sheet cassette 21 (see, FIG. 20) and to detect the size of paper sheets 20 set in sheet cassette 21, print control unit 40 starts paper conveyance (paper feeding) suitable for paper sheet 20 that is detected. Note that paper conveyance motor 44 is connected with a planetary gear mechanism (not shown) and thus can be rotated in forward and reverse directions with driver 43. That is to say, conveying roller 25 and the like in the image forming apparatus can be selectively driven by changing the rotational direction of paper conveyance motor 44.

Upon a start of printing each paper sheet 20, print control unit 40 first drives paper conveyance motor 44 to rotate in the reverse direction to feed paper sheet 20 by a predetermined distance until paper entrance sensor 45 detects paper sheet 20. Subsequently, print control unit 40 drives paper conveyance motor 44 to rotate in the forward direction to convey paper sheet 20 to the printing mechanism inside image forming apparatus 1.

When paper sheet 20 reaches a printable position, print control unit 40 transmits timing signal SG3 (including main scanning and sub-scanning synchronizing signals) to the image processing unit (not shown) and receives video signal SG2 from the image processing unit. Video signal SG2 which is edited by the image processing unit page by page and received by print control unit 40 is transferred to each optical print head 13 as print data signal. Each optical print head 13 has multiple light-emitting thyristors arranged in line, each of the light-emitting thyristors being provided for printing one dot (pixel).

Such transmission and reception of video signal SG2 are performed for each print line. Optical print head 13 emits lights onto the surface of photosensitive drum 11 that is negatively charged. The information to be printed is thus produced as latent image dots having increased potential on the negatively-charged surface of photosensitive drum 11. Then, in developing device 14, negatively-charged toner is electrically attached to the latent image dots, which results in formation of a toner image on photosensitive drum 11.

Thereafter, the toner image on photosensitive drum 11 is conveyed to image transfer device 27 as photosensitive drum 11 rotates, and image transfer high-voltage power supply 51 is turned on to supply a positive potential in response to image transfer signal SG4. As a result, image transfer device 27 transfers the toner image onto paper sheet 20 that passes between photosensitive drum 11 and image transfer device 27. Paper sheet 20 on which the toner image is transferred is conveyed to fixing unit 28 having therein heater 28a and then comes in contact with fixing unit 28. The toner image is thus fixed on paper sheet 20 by heat of fixing unit 28. Paper sheet 20 on which the toner image is fixed is further conveyed so as to pass through the printing mechanism and paper exit sensor 46 and then discharged out of image forming apparatus 1.

Referring to detection by paper size sensor 48 and paper entrance sensor 45, print control unit 40 applies a voltage from image transfer high-voltage power supply 51 to image transfer device 27 only while paper sheet 20 is passing through image transfer device 27. After the printing is finished and paper sheet 20 passes through paper exit sensor 46, print control unit 40 instructs charging high-voltage power supply 50 to stop application of voltage to developing device 14 and, at the same time, instructs development and transfer process motor 42 to stops the rotation thereof. This operation is repeated thereafter.

(Structure of Optical Print Head)

Figure 4:
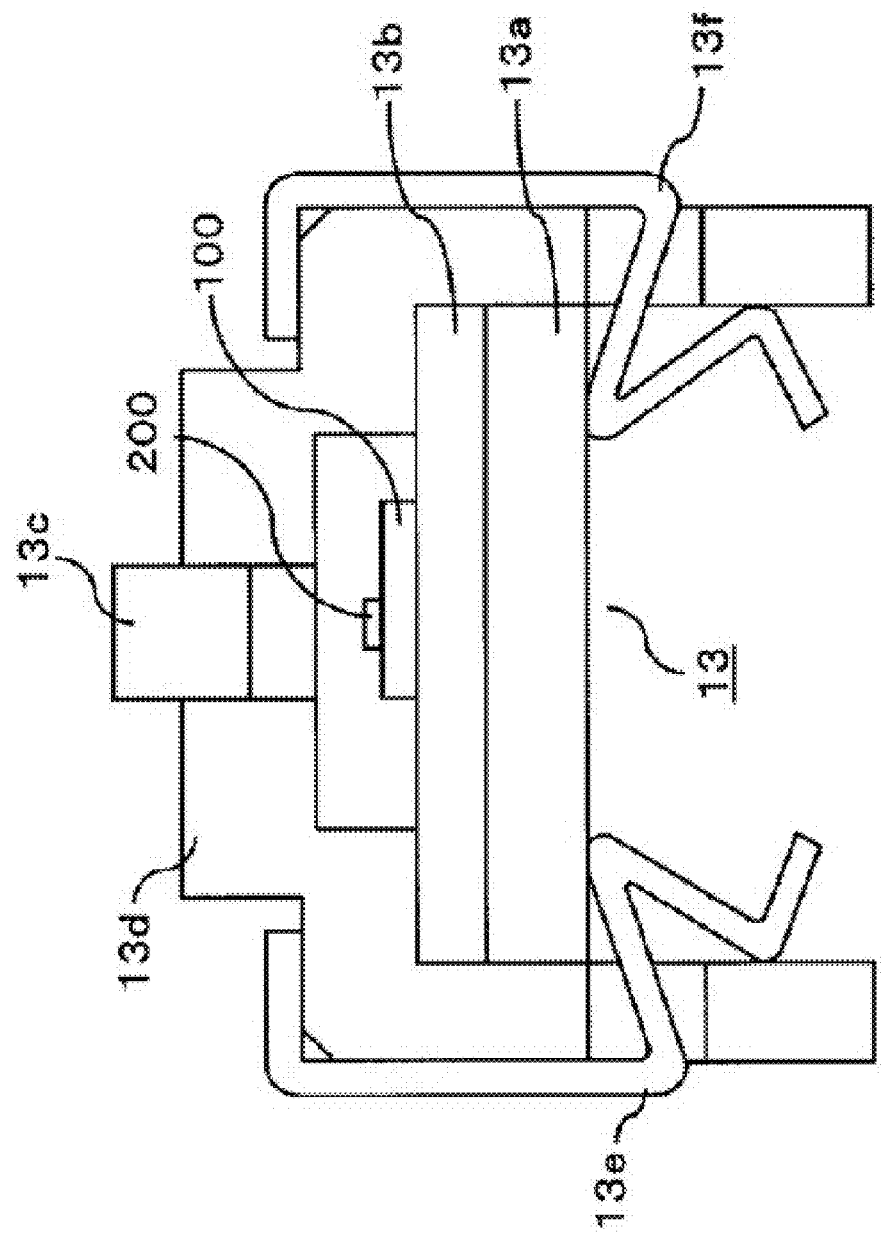
FIG. 4 is an outline sectional view of the structure of optical print head 13 shown in FIG. 3.

FIG. 4 is a cross-sectional view schematically illustrating the structure of optical print head 13 shown in FIG. 3.

Optical print head 13 includes base member 13a, and printed wiring board 13b fixed on base member 13a. Plural chip-shaped driver ICs 100 are fixed on printed wiring board 13b with a hardening resin or the like. Driven element arrays (for example, chip-shaped light-emitting thyristor arrays) 200 are attached on driver ICs 100. Rod lens array 13c, in which columnar optical elements are arranged, is provided above light-emitting thyristor arrays 200 and is fixed by holder 13d. Base member 13a, printed wiring board 13b, and holder 13d are fixed by clamp members 13e and 13f.

(Optical Print Head Board Unit)

Figure 5:
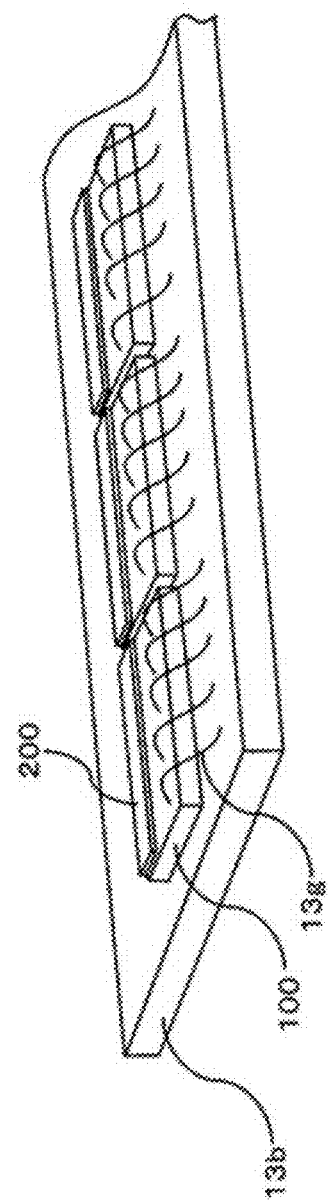
FIG. 5 is a perspective view of a board unit of optical print head 13 shown in FIG. 4.

FIG. 5 is a perspective view of a board unit of optical print head 13 shown in FIG. 4.

The optical print head board unit includes printed wiring board 13b and plural chip-shaped driver ICs 100 fixed on printed wiring board 13b. In each driver IC 100, a driving circuit for driving the light-emitting thyristor (for example, a shift register for driving a gate) is formed. Chip-shaped light-emitting thyristor array 200 formed of an epi film is attached on each driver IC 100. Driver IC 100 and light-emitting thyristor array 200 are electrically connected to each other with thin film wires. Driver IC 100 and light-emitting thyristor array 200 collectively make up a semiconductor composite device chip. Terminals of driver IC 100 and light-emitting thyristor array 200 are connected to terminal pads (not shown) provided on printed wiring board 13b with bonding wires 13g.

For manufacturing the optical print head board unit, for example, a wafer wherein the semiconductor composite devices are arrayed is divided into chips as semiconductor composite device chips by a well-known dicing method, some of the semiconductor composite device chips are fixed on printed wiring board 13b, and the semiconductor composite device chips that is fixed on printed wiring board 13b are electrically connected to printed wiring board 13b with bonding wires 13g.

(Semiconductor Composite Device Chip)

FIGS. 6A and 6B are circuit diagrams illustrating the configuration of the semiconductor composite device chip comprising driver IC 100 and light-emitting thyristor array 200 shown in FIG. 5: FIG. 6A is a circuit diagram of the entire device; and FIG. 6B is a circuit diagram of shift register 101 shown in FIG. 6A.

Driver IC 100 is formed of, for example, gate driving shift register 101 for time-sharing of driving the light-emitting thyristor array 200. Shift register 101 is made from, for example, silicon base material and includes multi-series (eight series, in this example) of flip flop circuits (hereinafter, referred to as "FF") 110-1 to 110-8 which are cascade connected. Shift register 101 includes data input terminal A to which serial data SI are input, clock input terminal CK to which serial clock SCK are input, and eight output terminals Q1 to Q8 from which shifted data are output. Data input terminal A is connected to data input terminal d of first FF 110-1 in shift register 101. Eight output terminals Q1 to Q8 are respectively connected to data output terminals g of FFs 110-1 to 110-8. Clock input terminal CK is connected to clock input terminal CK of each FF 110-1 to 110-8.

Such shift register 101 having the described configuration is synchronized with input serial clock SCK, shifts input serial data SI with flip flop circuits 110-1 to 110-8 in this order, and outputs the shifted data from output terminals Q1 to 08. Note that although only eight output terminals Q1 to Q8 are illustrated in drawings for simplifying the description, optical print head 13 that is capable of printing on A4-size paper sheet 20 with a printing resolution of 600 dots per inch includes 4992 output terminals Q1 to Q4992, for example.

Light-emitting thyristor array 200 connected to shift register 101 is made from an epi film including plural light-emitting thyristors 210 (210-1 to 210-8). Note that although eight light-emitting thyristors 210 are illustrated in the drawings for simplifying the description, 4992 light-emitting thyristors 210 are arranged, like output terminals Q1 to Q8. Light-emitting thyristors 210-1 to 210-8 each have an anode, a cathode, and a gate, such that the anodes are connected to terminal D, the cathodes are connected to ground GND, and the gates are respectively connected to output terminals Q1 to Q8 of shift register 101.

An anode driving circuit not shown) is connected to terminal D, such that an anode driving current from the anode driving circuit is supplied to the anode of each light-emitting thyristors 210-1 to 210-8.

It is preferable that the anode driving circuit is disposed in print control unit 40 shown in FIG. 3. In this embodiment, the anode driving circuit is provided in print control unit 40 but is not illustrated in FIG. 6. Note that the anode driving circuit may be provided in optical print head 13.

The semiconductor composite device chip comprising shift register 101 and light-emitting thyristor array 200 having the above configuration is manufactured as follows, for example.

To manufacture the semiconductor composite device chip, PNPN layered epi films, each of which are part of light-emitting thyristors 210-1 to 210-8, and an IC wafer including therein transistors which are part of shift registers 101 are initially prepared.

First, the epi films are attached onto the IC wafer.

Next, the main parts of light-emitting thyristors 210-1 to 210-8 are formed on the IC wafer by etching away unnecessary portions of each of the epi films on the IC wafer.

Next, the transistors in the IC wafer are connected to terminals of light-emitting thyristors 210-1 to 210-8 of each epi film with thin film wires, such that light-emitting thyristor arrays 200 and shift registers 101 are electrically connected.

Last, the IC wafer is divided into plural chips as the semiconductor composite device chips, each of which comprising light-emitting thyristor array 200 and shift register 101 are connected to each other.

By these steps, the semiconductor composite device comprising shift register 101 and light-emitting thyristor array 200 is manufactured.

(Structure of Semiconductor Composite Device Chip and Method of Manufacturing the Same)

The semiconductor composite device chip including shift register 101 and light-emitting thyristor array 200 according to the first embodiment is described below.

(Method of Manufacturing Epi Film (See FIGS. 7-1 and 7-2))

Figures 1, 7:
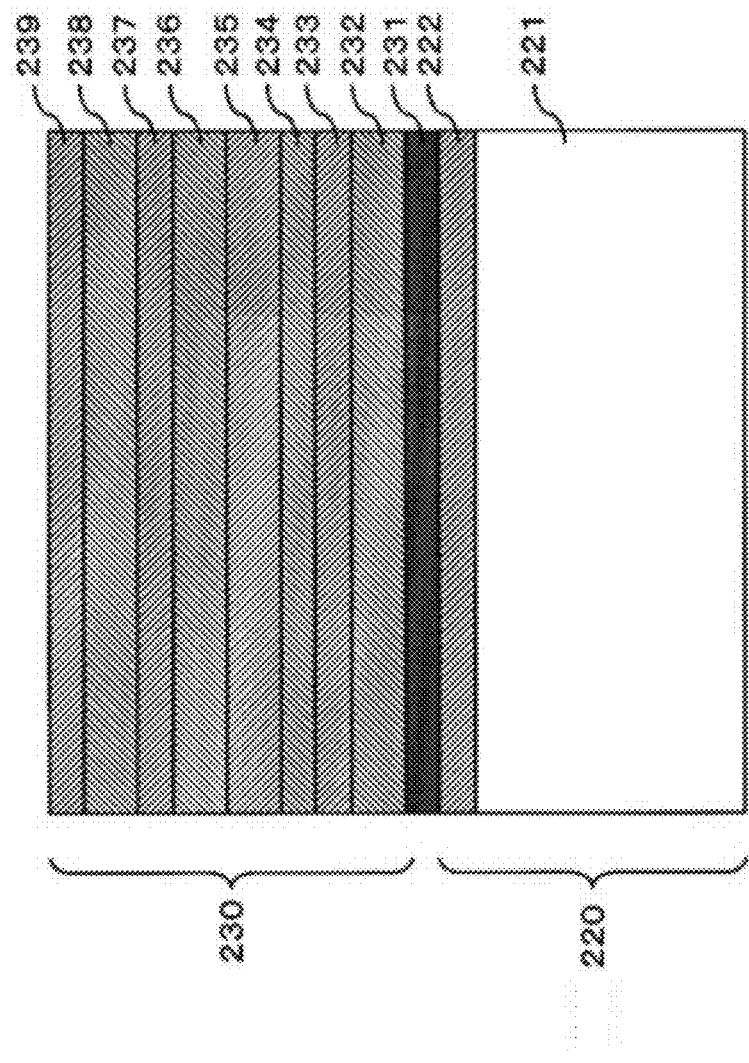
Figures 3, 7:
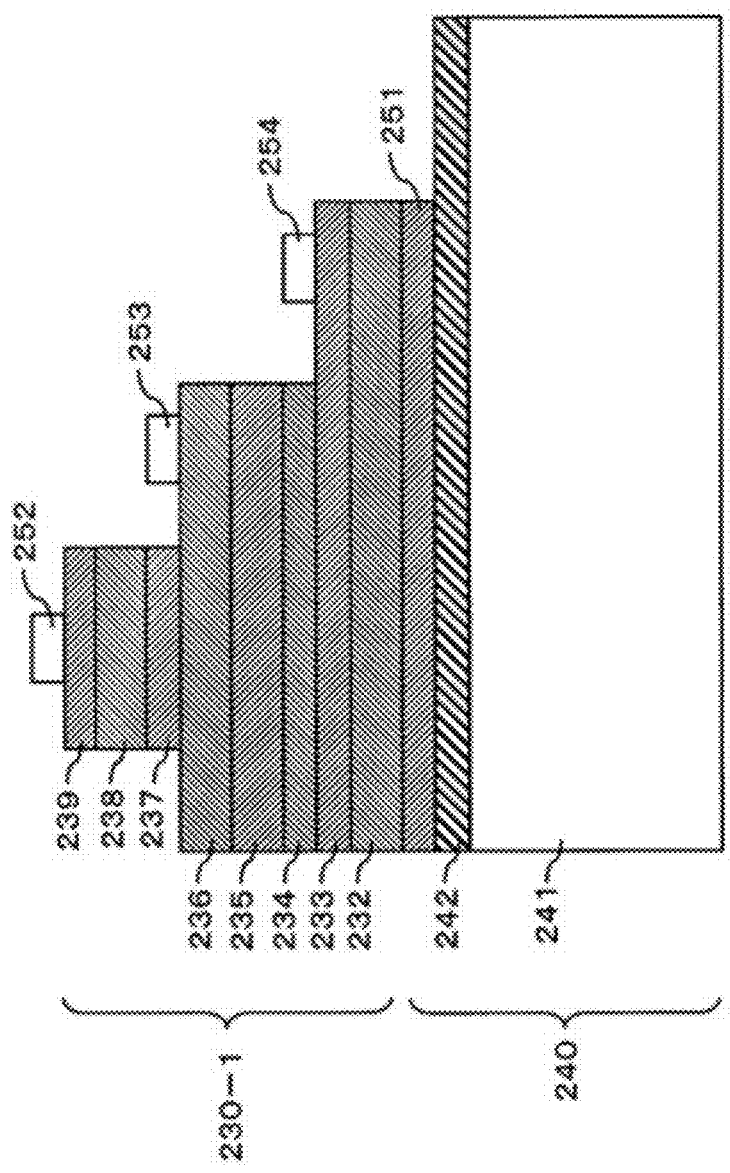

Before explaining the method of manufacturing the semiconductor composite device chip, the method of manufacturing the epi film used for the semiconductor composite device chip is explained with reference to FIGS. 7-1 and 7-2. FIGS. 7-1 and 7-2 are sectional views schematically illustrating the method of manufacturing the epi film for mesa-shaped light-emitting thyristors 210.

To form epitaxial layer 230 on base member 220 for manufacturing the epi films, as shown in FIG. 7-1, metal organic chemical vapor deposition (hereinafter, referred to as a "MOCVD method"), a molecular beam epitaxy thereinafter, referred to as a "MBE method") or the like is used.

First, GaAs buffer layer 222 is formed on GaAs substrate 221 thereby forming base member 220, and then aluminum-arsenic (AlAs) delamination layer 231 serving as a sacrificial layer is formed on GaAs buffer layer 222.

Next, n-type aluminum-gallium-arsenic (AlGaAs) layer 232 and n-type GaAs contact layer 233 are formed in this order on AlAs delamination layer 231. Next, indium-gallium-phosphorus (InGaP) etch-stop layer 234, p-type AlGaAs layer 235, n-type AlGaAs layer 236, InGaP etch-stop layer 237, p-type AlGaAs layer 238, and p-type GaAs contact layer 239 are formed in this order on n-type GaAs contact layer 233; thereby forming epitaxial layer 230.

Note that although a multi-layered structure having a different mix crystal ratio of AlGaAs is not illustrated in FIG. 7-1 for simplifying the description, a single heterojunction and a double heterojunction can be realized by changing the mix crystal ratio.

Next, the process of delaminating epitaxial layer 230 (epi film 230-1) is explained with reference to FIG. 7-2.

In the delaminating process, epitaxial layer 230 is etched in the direction of the thickness of epitaxial layer 230 to form trenches 240, one of which is shown in FIG. 7-2. Trenches 240 define the plan geometry of epi films 230-1. Trenches 240 are formed by photolithography using a resist mask patterned to define the trench areas and an etching solution containing, for example, citric acid, ammonia, and hydrogen peroxide.

Next, as shown in FIG. 7-2, AlAs delamination layer 231 is selectively removed by wet-etching.

In this wet-etching, AlAs delamination layer 231 is selectively removed by etching, since the wet-etching solution containing appropriate compositions etches AlAs delamination layer 231 at much a faster rate than that of etching the AlGaAs layers, the GaAs contact layers, and the etch-stop layers.

Note that FIG. 7-2 illustrates an intermediate stage of the etching in which a part of AlAs delamination layer 231 still remains. When the etching is completed, AlAs delamination layer 231 is completely removed, with epi films 230-1 remaining on base member 220.

Next, epitaxial layers 230 are delaminated from base member 220 thereby obtaining epi films 230-1.

Each of obtained epi films 230-1 has such a structure that n-type AlGaAs layer 232, n-type GaAs contact layer 233, InGaP etch-stop layer 234, p-type AlGaAs layer 235, n-type AlGaAs layer 236, InGaP etch-stop layer 237, p-type AlGaAs layer 238, and p-type GaAs contact layer 239 are layered in this order.

For delaminating epi film 230-1, a support member to support and protect epi film 230-1 may be provided on epi film 230-1. If such support member is provided on epi film 230-1, epi film 230-1 can be held to be transported to a predetermined place by holding the surface of the supporting member with a vacuum holder or with a photo-curable adhesive sheet that loses its adhesion by exposure to light, for example.

Note that after epitaxial layer 230 is delaminated, base member 220 having GaAs substrate 221 has the same structure as before the manufacturing process of that epitaxial layer 230 and thus can be re-used for manufacturing a new (another) epitaxial layer 230.

Note that the material of epi film 230-1 is a compound semiconductor crystal made of AlGaAs in this embodiment, other materials such as AlGaInP, gallium-nitrogen (GaN), AlGaN, InGaN, or the like may be used as the material of epi film 230-1.

The semiconductor composite device chip including shift register 101 and light-emitting thyristor array 200 according to the first embodiment is manufactured by the following steps (1) and (2), for example.

(1) Steps in FIG. 7-3

FIG. 7-3 is a sectional view for explaining the method of manufacturing the semiconductor composite device.

First, IC wafer 240 is prepared (see step S1 in FIG. 8). IC wafer 240 is formed by providing passivation film 242 serving as a protection film made of SiN, $SiO_2$ or the like on silicon substrate 241 wherein unillustrated transistors (see FIG. 7-4A), which are part of shift register 101, were previously formed, and further providing adhesive layer 251 (planarizing film) made of a material such as polyimide on passivation film 242.

Next, epi film 230-1 is attached on adhesive layer 251 of IC wafer 240 (see, step S2 in FIG. 8).

Next, unnecessary portions of epi film 230-1 are removed by etching (FIG. 8 see, steps S3 and S4 in FIG. 8). With this, p-type GaAs contact layer 239, which is the top layer of epi film 230-1, is exposed to become an anode region, n-type AlGaAs layer 236 is exposed to become a gate region, and n-type GaAs contact layer 233 is exposed to become a cathode region.

Next, after the etching, an unillustrated insulation film is provided on substantially the entire area of the epi film 230-1. The insulation film has a first opening to expose a part of n-type GaAs contact layer (the cathode region) 233 and a second opening to expose a part of n-type AlGaAs layer (the gate region) 236, and a third opening to expose p-type GaAs contact layer (the anode region) 239.

Next, a metal electrode that will be cathode 254 of light-emitting thyristors 210 is formed on the exposed portion of n-type GaAs contact layer (the cathode region) 233, a metal electrode that will be gate 253 of light-emitting thyristors 210 is formed on the exposed portion of n-type AlGaAs layer (the gate region) 236, and a metal electrode that will be anode 252 of light-emitting thyristors 210 is formed on the exposed portion of p-type GaAs contact layer (the anode region) 239.

With the above described steps, the formation of light-emitting thyristors 210 on IC wafer 240 is completed.

Note that anode 252, gate 253, and cathode 254, which are the metal electrodes, may be formed separately in different steps in this embodiment, but it is preferable that anode 252, gate 253, and cathode 254 are formed at the same time in one step in such a manner that they do not intersect with each other on the same plane.

Although edges of the layers of epi film 230-1 are illustrated vertical to the layers in FIG. 7-3 for simplifying the drawing, it is preferable that the edges of the layers of epi film 230-1 are sloped in order not to brake metal wires, which are to be connected to anode 252, gate 253, and cathode 254 later, at the edges of the layers of epi film 230-1, when or after wiring the metal wires. Accordingly, in order to easily form the slopes upon etching epi film 230-1 made of AlGaAs to obtain mesa-shaped epi film 230-1, the crystal orientation of epi film 230-1 and the etching solution are appropriately determined.

Note that although light-emitting thyristor 210 is described as homo-junction light-emitting thyristor 210 for simplifying the drawings in this embodiment, light-emitting thyristor 210 may be a single-hetero light-emitting thyristor as epitaxial layer 230 having a PNPN juncture structure wherein plural epitaxial layers are layered in a single-hetero fashion, a double-hetero light-emitting thyristor as epitaxial layer 230 having a PNPN juncture structure wherein plural epitaxial layers are layered in a double-hetero fashion, a distributed bragg reflection (hereinafter, referred to as "DBR") light-emitting thyristor wherein plural gradient index layers are formed, or the like.

FIG. 7-4A and 7-43 are plan views schematically illustrating the semiconductor composite device chip shown in FIG. 7-3, before the metal wiring step which is described later is executed. FIG. 7-4A is a plan view of the semiconductor composite device chip of FIG. 7-3, and FIG. 7-4B is a plan view illustrating a N-channel MOS transistor (hereinafter, referred to as "NMOS") and a P-channel MOS transistor (hereinafter, referred to as "PMOS") shown in FIG. 7-4A.

Note that in FIG. 7-4A, the outline of silicon substrate 241 shows a dicing line, along which IC wafer 240 is diced to be divided into the plural chips as the semiconductor composite device chips and which will be the outside edge of each of the semiconductor composite device chips. Within an area defined by the dicing line, one of the epi films 230-1 is to be attached.

Figure 6:
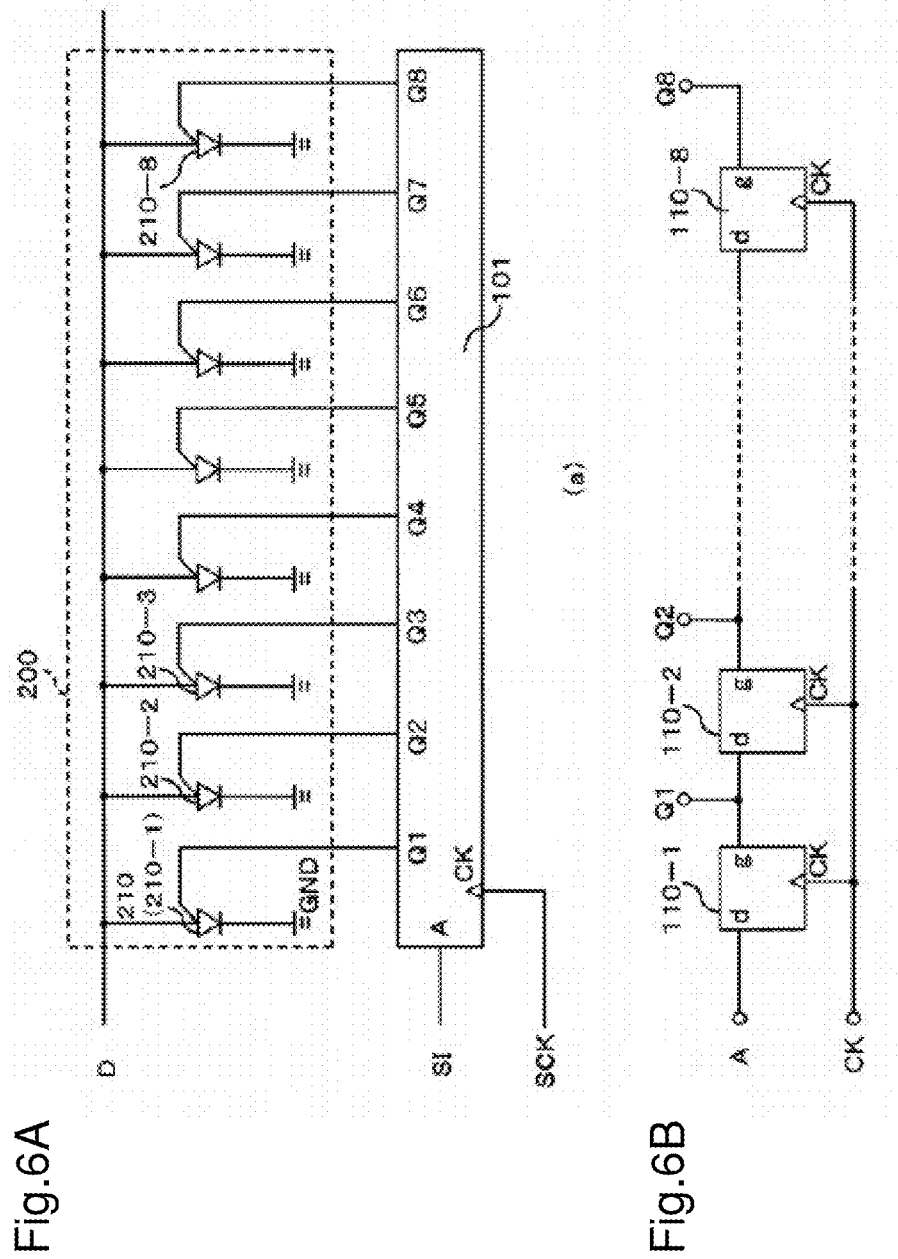
FIGS. 6A and 6B are diagrams illustrating the circuit of the semiconductor composite device chip including driver IC 100 and light-emitting thyristor array 200 shown in FIG. 5.

Near epi film 230-1 in silicon substrate 241, PMOSs 111 and 112 and unillustrated PMOSs and NMOSs 113 and 114 and unillustrated NMOSs, which are to be part of FFs 110-1 to 110-8 of shift register 101 shown in FIG. 6, are formed. FIG. 7-4 illustrates the circuit diagram using circuit symbols for simplifying the drawing.

PNMOS 111 includes source terminal (hereinafter, referred to as source) 115, and drain terminal (hereinafter, referred to as drain) 116. NMOS 113 includes source 118 and drain 117. PMOS 111 and NMOS 113 also have common gate terminal (hereinafter, referred to as gate) 119 which is provided on a later-described polysilicon wire.

Note that PMOS 111 and NMOS 113 are connected to each other via their common gate 119 to form an inverter, and source 115, source 118, and drain 116 will be connected to the power source (not shown), the ground, and drain 117, respectively, in the metal wiring step to be executed later to form the first FF 110-1 of shift register 101. Like PMOS 111 and NMOS 113, PMOS 112 and NMOS 114 are part of the second FF 110-2 of shift register 101, and the other unillustrated PMOSs and NMOSs are part of the third to the eighth FF 110-3 to 110-8 of shift register 101.

Note that each of FFs 110-1 to 110-8 may be formed of an inverter and a transmission gate. In the case where the inverter and the transmission gate are used, the inverter is easily manufactured in such a structure that sources of a PMOS and a NMOS are connected to each other and drains of the MOS and the NMOS are connected to each other, a gate of the PMOS and a gate of the PMOS are separately provided.

In silicon substrate 241 to which epi film 230-1 is to be attached, the circuit elements such as the transistors are previously formed and the polysilicon wires connecting the circuit elements to each other are previously formed to the utmost extent. Therefore, in the metal wiring step to be executed later, appropriate distances between the wires can be maintained to prevent an intersection of the metal wires and avoid a short circuit.

FIG. 7-4B is a plan view illustrating MOS transistors corresponding to PMOS 111 and NMOS 113 shown in FIG. 7-4A.

In an example shown in FIG. 7-4B, silicon substrate 241 is a n-type silicon substrate. In n-type silicon substrate 241, p-well region 123 and polysilicon wire 121 for forming NMOS 113 are formed at predetermined areas. P-type impurity region 122 for forming PMOS 111 is a rectangular region into which a p-type impurity is implanted with polysilicon wire 121 as a mask and is divided by such polysilicon wire 121 into two regions, one of which is a source region 122a at which source 115 as a contact is formed and the other is a drain region 122b at which drain 116 as a contact is fanned.

N-type impurity region 124 for forming NMOS 113 is a rectangular region which is formed in p-well region 123 and into which an n-type impurity is implanted with polysilicon wire 121 as a mask. Such n-type impurity region 124 is divided by polysilicon wire 121 as a gate into two regions, one of which is a source region and the other is a drain region. Source 118 as a contact is formed at the source region and drain 117 as a contact is formed at the drain region.

PMOS 111 and NMOS 113 having the above structure and formed in silicon substrate 241 will be the inverter after the metal wiring step to be executed later. In the metal wiring step, source 115, source 118, and drain 116 are connected to the power source (not shown), the ground, and drain 117, respectively, so that drains 116 and 117 become the output terminal of the inverter and contact area 119 of polysilicon wire 121 becomes the input terminal of the inverter. Note that in the metal wiring step, not only the inverter is manufactured but also other circuit elements are connected to each other with the metal wire (s) to make up shift register 101.

(2) Wiring Step (see FIG. 1)

After the above steps (that is, steps S1 to S4 in FIG. 8), metal wiring step (see step S5 in FIG. 8) is executed. FIG. 1 is an outline sectional view of the semiconductor composite device after the metal wiring step is executed according to the first embodiment.

In the metal wiring step, anode wire 265 is wired (formed) such that anode wire 265 is connected to anode 252 of light-emitting thyristors 210, gate wire 266 is wired (formed) such that gate wire 266 is connected to gate 253 of light-emitting thyristors 210 and connected to drain region 122b of PMOS 111 through drain opening 116a, and wire 267 is wired (formed) such that wire 267 is connected to the power source and the wire 267 is connected through source opening 115a to source region 122a of PMOS 111 which is connected to the ground.

The metal wires such as anode wire 265, gate wire 266, and wire 267 are wired (formed) in the same step (at the same time) after etching the epi film 230-1 of light-emitting thyristors 210 made of the PNPN layers. For example, the metal wires are formed, by forming a sputtered metallization layer of a metal material such as Aluminum on the entire surface of the wafer and then removing unnecessary portions by photolithography, such that the metal wires not only connect light-emitting thyristors 210 and shift register 101 but also connect the elements of shift register 101 to each other to form shift register 101 itself.

Note that the method of forming the metal wires is not limited to the above description but the metal wires may be formed by well-known lift-off method or the like.

Note that in FIG. 1, interlayer insulation film 244 is illustrated under passivation film 242 and an area 243 including interlayer insulation film 244 enclosed by the dotted line is circuit formation layer 243 comprising the transistors and the like. IC wafer comprising silicon substrate 241 and circuit formation layer 243 including MOS transistors or the like is manufactured by well-know complementary MOS transistor process (hereinafter, referred to as "CMOS").

In FIG. 1, for simplifying the drawing, only PMOS 111, which is a part of shift register 101, is illustrated. PMOS 111 includes polysilicon wire 121 as the gate region, the drain region 122b of p-type impurity diffusion region 122, and the source region 122a of p-type impurity diffusion region 22. Source opening 115a and drain opening 116a, which extend from the upper surface of passivation film 242 through interlayer insulation film 244 to the depth of the semiconductor layer, are formed corresponding to the source region 122a and the drain region 122b of PMOS 111 (the terminals of the circuit elements), respectively.

Note that n-type AlGaAs layer (cathode layer) 264 in FIG. 1 corresponds to n-type AlGaAs layer 232 in FIG. 7-3, p-type AlGaAs layer 263 in FIG. 1 corresponds to p-type AlGaAs layer 235 in FIG. 7-3, n-type AlGaAs layer (gate layer) 262 in FIG. 1 corresponds to n-type AlGaAs layer 236 in FIG. 7-3, p-type AlGaAs layer (anode layer) 261 in FIG. 1 corresponds to p-type AlGaAs layer 238 in FIG. 7-3, and contact layers 239 and 233 and etch-stop layers 237 and 234 are omitted in FIG. 1 for simplifying the drawing.

(Outline Process of Manufacturing Semiconductor Composite Device Chip)

Figures 8A, 8B, 8C:
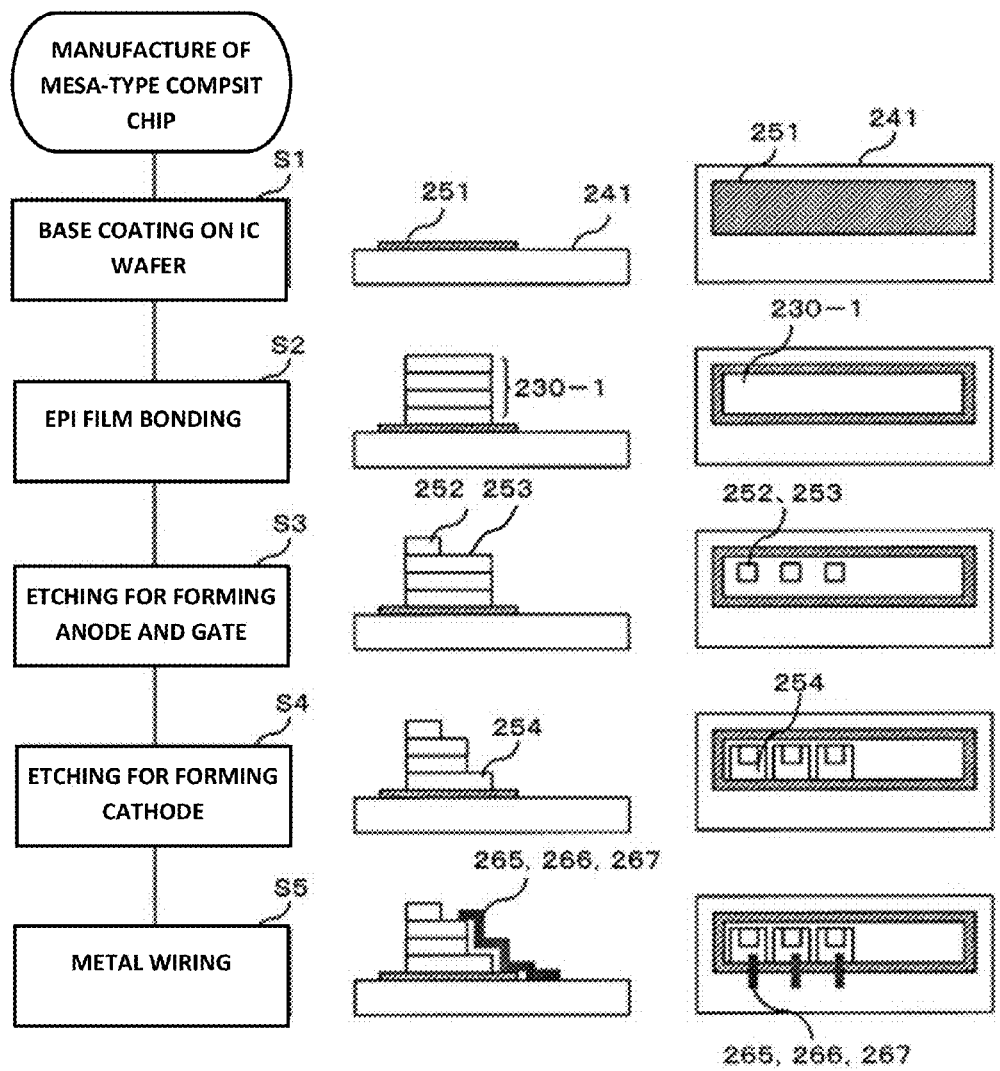
FIGS. 8A to 8C are views illustrating an outline process of manufacturing the semiconductor composite device of the mesa-type shown in FIG. 7-3 and FIG. 1

FIGS. 8A to 8C are views schematically illustrating the process of manufacturing the mesa-shaped semiconductor composite device chip, wherein FIG. 8A is a flowchart of the manufacturing process and FIGS. 8b and 8C are sectional views and plan views corresponding to the flow shown FIG. 8A.

According to the manufacturing process for the semiconductor device chip of the mesa-type, in step S1, which is a base coating process of IC wafer 240, adhesive layer 251 as a planarizing film is formed at a predetermined portion on the surface of IC wafer 240 after the transistors, which are part of shift register 101 and have not yet been wired, is formed in an upper layer region of IC wafer 240.

In step S2, which is an epi film bonding step, the epi film 230-1 previously formed is attached on adhesive layer 251 of IC wafer.

In step S3, which is an etching step for forming an anode and a gate, anode 252 and gate 253 of light-emitting thyristors 210 are formed.

In step S4, which is an etching step for forming a cathode, cathode 254 of light-emitting thyristors 210 is formed.

After that, in step S5, which is a metal wiring step, anode wire 265 and gate wire 266 for light-emitting thyristors 210, and wire 267 for shift register 101 are formed, thereby obtaining the semiconductor composite device chip.

Operation of Optical Print Head of First Embodiment

Figure 9:
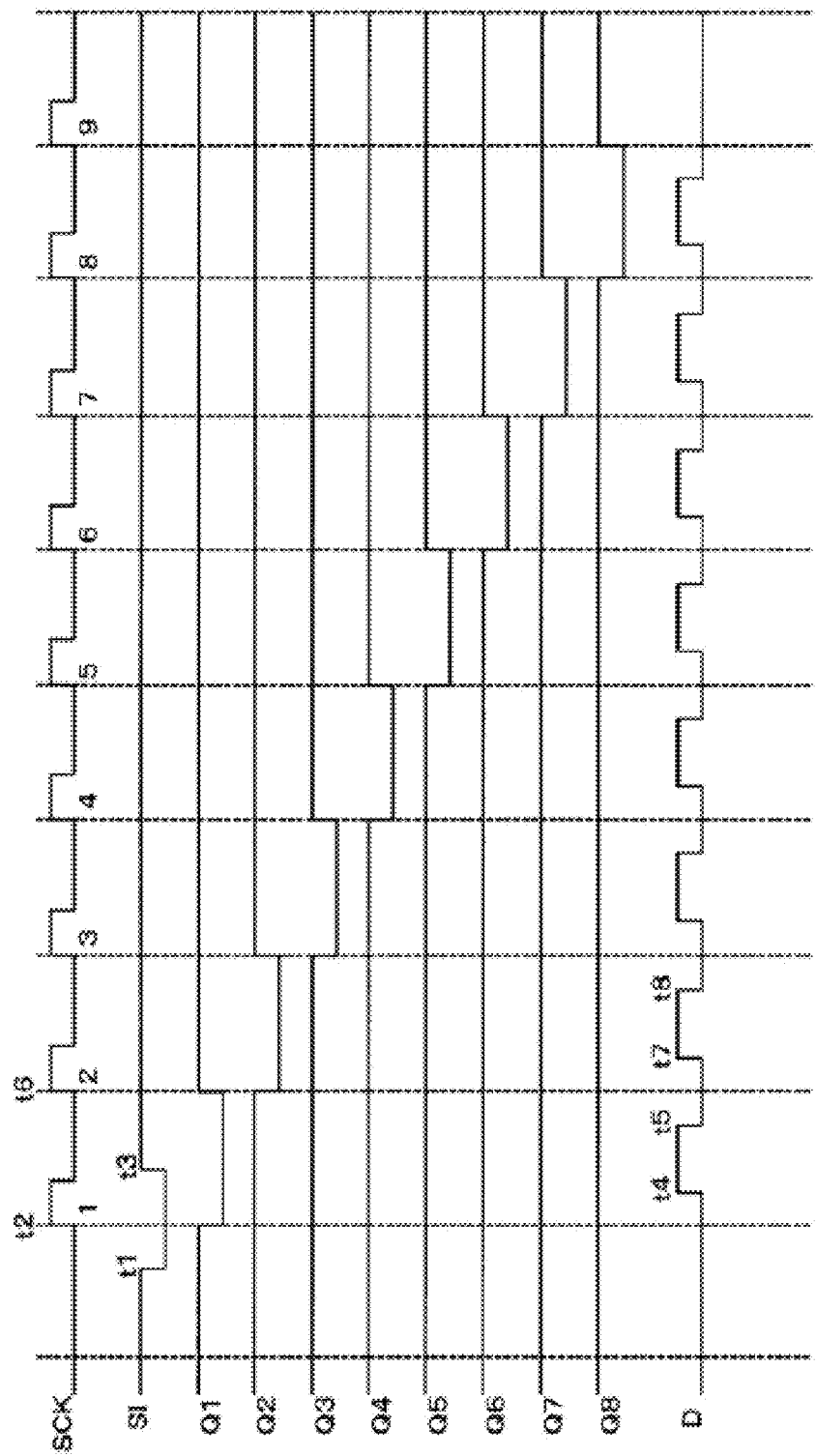
FIG. 9 is a time chart for explaining the operation of optical print head 13 shown in FIG. 6.

FIG. 9 is a time chart of the operation of optical print head 13 shown in FIG. 6.

FIG. 9 illustrates waveforms in the printing operation of image forming apparatus 1 when one line is scanned (formed) by lighting light-emitting thyristors 210-1 to 210-8 shown in FIG. 6 in this order.

Note that, in a preparatory operation (not shown in FIG. 19) that is executed when the image forming apparatus is powered up, shift register 101 is preset. Specifically, in this preset operation (the preparatory operation), serial data input terminal A of shift register 101 shown in FIG. 6 is held at a high level while a number of pulses of serial clock SCK equal to the number of the stages of shift register 101 are input to the clock input terminal CK. This sets all output terminals Q1 to Q8 of shift register 101 to high level.

As shown in FIG. 9, to start scanning the one line, serial data SI is hold low at time U. Then, at time t2, the first pulse of serial clock SCK is raised. At time t2 (that is, at the rising edge of this pulse of serial clock SCK), input serial data SI is latched in flip flop circuit 110-1 of the first stage in shift register 101, and right after that, terminal Q1 of first stage flip flop circuit 110-1 goes to the low level. When output terminal Q1 is turned to low at time t2, the gate voltage of light-emitting thyristor 210-1 goes low. At time t3 after the rising edge of serial clock SCK, serial data SI is driven to the high level again.

At time t4, an anode driving signal which is input from the anode driving circuit (not shown) to terminal 13 goes to the high level. This creates a potential difference between the anode and the gate of light-emitting thyristor 210-1 in the forward direction, and generates a trigger current that turns on light-emitting thyristor 210-1 to emit light. Note that most of the light emission of light-emitting thyristor 210-1 is due to a current flow between the anode and the cathode, and thus a voltage applied between the anode and the cathode needs to be reduced to zero to turn off the turned-on light-emitting thyristor 210-1. For that purpose, terminal D is driven to the low level at time t5.

Note that although FIG. 9 illustrates the case where terminal D is driven to the high level to turn on light-emitting thyristor 210-1 at time 4 and terminal D is driven to the low level to turn off light-emitting thyristor 210-1 at time t5, so as to form a dot, terminal D is kept low from time t4 to t5 if light-emitting thyristor 210-1 does not need to emit light to form the dot. In other words, in response to the level of the anode driving signal input to terminal D, light-emitting thyristor 210-1 is controlled to be on or off.

At time t6, serial clock SCK goes high again while serial data SI input to data input terminal A has been kept high. Slightly later than time t6, output terminal Q1 goes to high and output terminal Q2 goes to low.

At time t7, the anode driving signal input to terminal D goes to high. This creates a potential difference between the anode and the gate of light-emitting thyristor 210-2 and thus generates the trigger current which turns on light-emitting thyristor 210-2 to emit light. Note that most of the light emission of light-emitting thyristor 210-2 is due to the current flow between the anode and the cathode, and thus a voltage applied between the anode and the cathode needs to be reduced to zero to turn off the turned-on light-emitting thyristor 210-1. Because of this, terminal D is driven to the low level at time t8.

As is clear from the above description, at each of the rising edges of pulses 1, 2, 3, 4, 5, 6, 7, and 8 of serial clock SDK shown in FIG. 6, the output signals from output terminals Q1, Q2, Q3, Q4, Q5, Q6, Q7, and Q8 go to the low level in turn, one at a time, with the other remaining at the high level. Accordingly, when the anode driving signal input to terminal D is high, whichever one of light-emitting thyristors 210-1 to 210-8 connected to output terminals Q1 to Q8 receiving a low shift register output turns on and emits light. The illuminating time lengths of light-emitting thyristors 210-1 to 210-8 corresponds to time intervals, such as an interval between times t4 to t5, and an interval between times t7 to t8 shown in FIG. 9. The illuminating time lengths of light-emitting thyristors 210-1 to 210-8 are thus able to be controlled separately.

Note that, light-emitting thyristor 210 is turned on by applying the potential difference between the anode and the gate of light-emitting thyristor 210 in the forward direction, whereas light-emitting thyristor 210 is kept off only by maintaining the forward potential difference less than the threshold of the forward potential difference. Thus, in order to keep light-emitting thyristor 210 off, the forward potential difference may be controlled to zero or a reverse potential difference may be applied.

The current in light-emitting thyristor 210 mainly flows between the anode and the cathode but does not flow much through the gate to control light-emitting thyristor 210 to turn on and off. Accordingly, output terminals Q1 to Q8, or the like, of shift register 101 do not need to have large current driving capabilities.

Therefore, the transistors to driving output terminals Q1 to Q8 need only very small areas in shift register 101 and thus do not require a large area in the chip. As a result, the cost of the semiconductor composite device chip including shift register 101 can be reduced and thus the manufacturing costs of optical print head 13 and image forming apparatus 1 can be significantly reduced.

Modifications of First Embodiment

Figure 10:
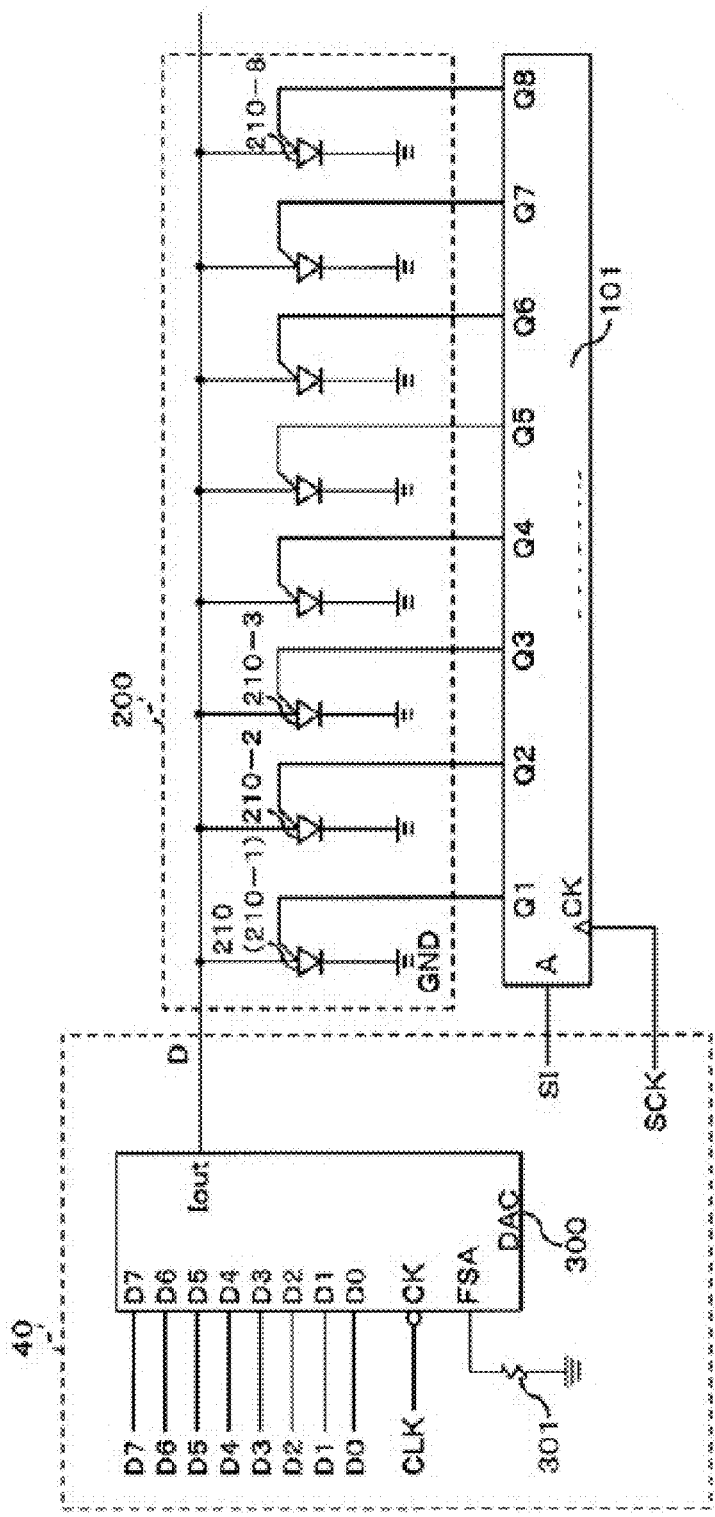
FIG. 10 is a circuit diagram of a modification of the structure of optical print head 13 of the first embodiment shown in FIG. 6A.

FIG. 10 is a circuit diagram of a modification of optical print head 13 shown FIG. 6A of the first embodiment. In FIG. 10, the same configurations as in FIG. 6A are designated by the same reference numerals.

In optical print head 13 according to this modification, like the first embodiment, light-emitting thyristor array 200 is attached on the IC wafer (not shown in FIG. 10) wherein driver IC 100 (not shown in FIG. 10) having shift register 101 is formed. Data input terminal A and clock input terminal CK of shift register 101, and terminal D of light-emitting thyristor array 200 are connected to the output side of print control unit 40 shown in FIG. 3.

Print control unit 40 includes therein the anode driving circuit (for example, a current output digital-analog converter, referred to as "DAC") 300. DAC 300 is connected to terminal D of light-emitting thyristor array 200. DAC 300 includes: digital signal input terminals D7 to D0 to which 8-bit digital signals D7 to D0 are input respectively; clock input terminal CK to which clock CLK used for transmitting digital signals D7 to D0 is input; FSA terminal connected to ground GND through resistance 301; and output terminal Iout, from which the anode driving signal which has an analog value of 256 selectable levels. Digital signal input terminals D7 to D0 are connected to a print data creating circuit (not shown) in print control unit 40, and output terminal Iout is connected to terminal D of light-emitting thyristor array 200. The print data creating circuit (not shown) in print control unit 40 creates 8-bit digital signals D7 to D0 each of which have one of drive instruction values corresponding to 256-level driving energies for each printing dot.

DAC 300 can be any device of the current output type. In this modification, DAC 300 is the device DAC 908 which is manufactured by the Burr-Brown Corporation (now merged with Texas Instruments, U.S.A.).

DAC 300 is a circuit that receives 8-bit digital signals D7 to D0 through digital signal input terminals D7 to D0, converts the digital signals into analog values and outputs the anode driving signals, each of which has one of 256-level current value, through output terminal Iout.

Resistance 301 connected to FSA terminal of DAC 300 is used for setting the maximum current of the anode driving signal output from output terminal Iout, with a reference voltage value generated in DAC 300. When digital signal D7 to D0 is its minimum value (hexadecimal "00"), the current of the anode driving signal output from output terminal Iout becomes zero. When digital signal D7 to D0 is its maximum value (hexadecimal "FF", decimal "225"), the current of the anode driving signal output from output terminal Iout becomes the maximum driving current. The anode driving signal output from output terminal Iout is supplied to the anodes of light-emitting thyristors 210 (=210-1 to 210-8) through terminal D.

Figure 11:
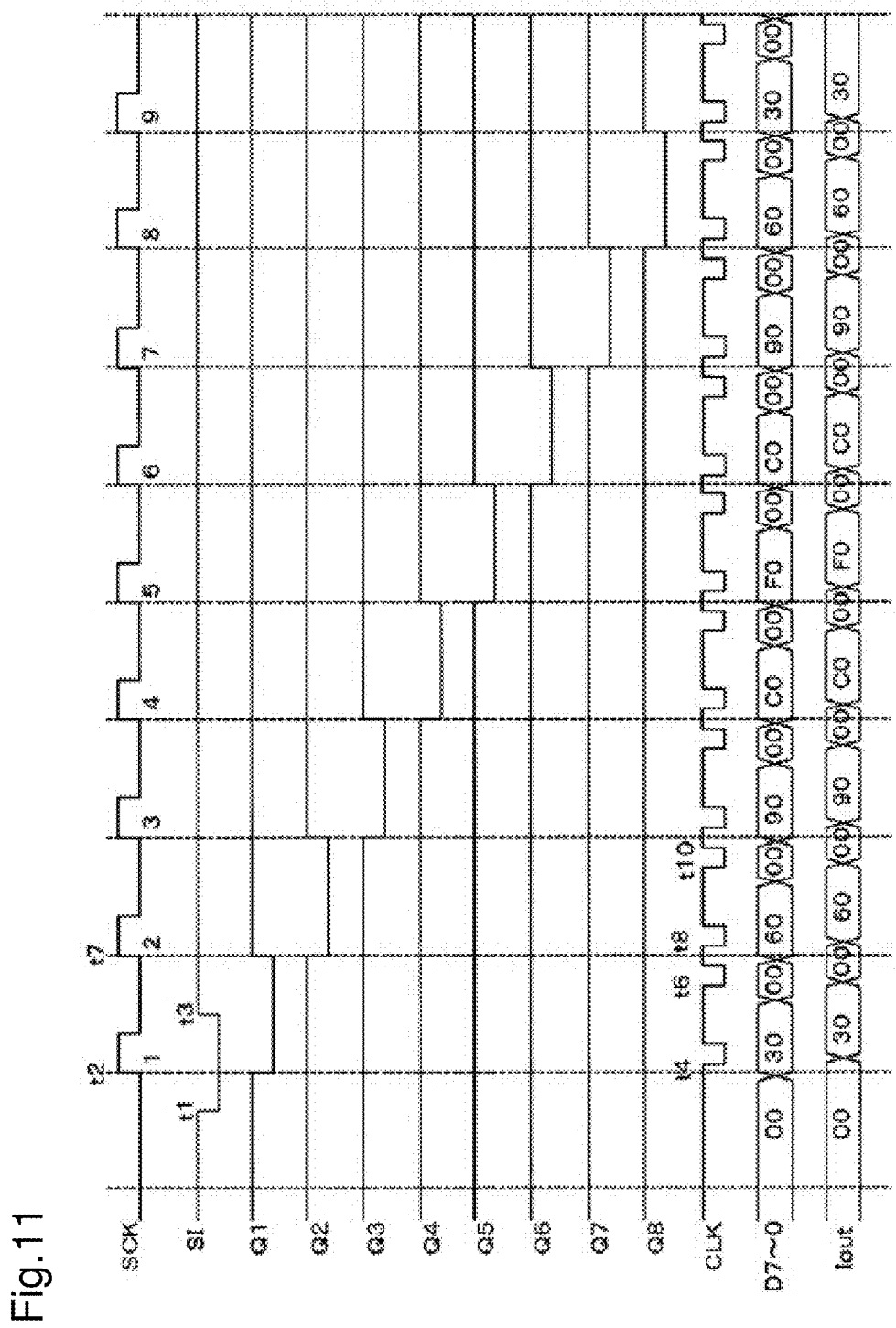
FIG. 11 is a time chart for explaining the operation of optical print head 13 of FIG. 10

FIG. 11 is a time chart illustrating the operation of optical print head 13 shown in FIG. 10, to be compared with FIG. 9 of the first embodiment.

Note that in FIG. 11, the numeric values of digital signals D7 to D0 are hexadecimal digital values, and the numeric values of output terminal Iout are also hexadecimal digital values. FIG. 11 illustrates waveforms in the printing operation of image forming apparatus 1 according to the modification when one line is scanned (formed) by lighting light-emitting thyristors 210-1 to 210-8 in this order.

Note that, like FIG. 9 of the first embodiment, in a preparatory operation (not shown in FIG. 11) that is executed when image forming apparatus 1 is turned on, shift register 101 is preset. In this preset operation (the preparatory operation), serial data SI input to serial data input terminal A is hold high while eight pulses of serial clock SCK, which is equal to the number of the stages of shift register 101, are input to the clock input terminal CK. This sets all output terminals Q1 to Q8 of shift register 101 to high.

As shown in FIG. 11, to start scanning one line, at time t1, serial data SI input to data input terminal A is held low at time T1. Then, at time t2, the first pulse of serial clock SCK is input to shift register 101. At the rising edge of the first pulse of serial clock SCK (that is, at time t2), this is latched in flip flop circuit 110-1 of the first stage in shift register 101 shown in FIG. 6B, and right after that, output terminal Q1 of first flip flop circuit 110-1 goes to low. When output terminal Q1 goes to low at time t2, the gate voltage of light-emitting thyristor 210-1 goes low. At time t3 after the rising edge of serial clock SCK, serial data SI is again driven to the high level.

In this modification shown in FIG. 11, in synchronization with the rise of the first pulse, hexadecimal "30" is input to DAC 300 as digital signals D7 to D0.

At time t4, clock CLK input to clock input terminal CK of DAC 300 goes low. This cause DAC 300 to latch the hexadecimal value "30" input to digital signal input terminals D7 to D0 and outputs, from output terminal Iout to the anodes of light-emitting thyristors 210-1 to 210-8 via terminal D, the anode driving signal having the current level proportional to the latched the hexadecimal value "30". This generates the potential difference between the anode and the gate of light-emitting thyristor 210-1, so that the trigger current flows between the anode and the gate of light-emitting thyristor 210-1, thereby turning on light-emitting thyristor 210-1 to emit light.

Most of the light emission of light-emitting thyristor 210-1 is due to the current flow between the anode and the cathode, and thus a voltage applied between the anode and the cathode need to be reduced to zero to turn off the turned-on light-emitting thyristor 210-1. Because of this, digital signals D7 to D0 to digital signal input terminals D7 to D0 are driven to "00" at time t5, and then the potential of clock CLK is driven to low at time t6 to make digital signals D7 to D0 the value "00" to be latched into DAC 300. With this, slightly after clock CLK of time t6, the anode driving signal output from output terminal Iout goes zero corresponding to input digital signals D7 to D0 having the hexadecimal value "00" to turn off light-emitting thyristor 210-1.

Note that, the example shown in FIG. 11 latches the hexadecimal value "30" of digital signals D7 to D0 input to digital signal input terminals D7 to D0 at time t4 to output the anode driving signal having the driving current value corresponding to the hexadecimal value "30" from output terminal Iout in order to turn on light-emitting thyristor 210-1, and latches the hexadecimal value "00" of digital signals D7 to D0 at time t6 to make the driving current value of the anode driving signal to zero in order to turn off light-emitting thyristor 210-1. However, in the case where light-emitting thyristor 210-1 does not need to be turned on, digital signals D7 to D0 is kept "00" during times t2 to t5.

As described above, the current value of the anode driving signal is changed depending on the 255-level value (that is, current instruction value) of digital signals D7 to D0, as well as light-emitting thyristor 210-1 is controlled to be turned on or off based on the value of digital signals D7 to D0.

Next, at time t7, serial clock SCK goes high. At time t7, serial data SI input to data input terminal A of shift register 101 is high. Accordingly, right after time t7, output terminal Q1 of shift register 101 goes to high and output terminal Q2 of shift register 101 goes to low, while digital signals D7 to D0 having the value "60" are input to digital data input terminals D7 to D0 of DAC 300.

At time t8, clock CLK goes low and thus the value "60" is latched into DAC 300. Accordingly, right after time t8, the anode driving signal having the current value corresponding to the data "60" is output from output terminal Iout of DAC 300. This creates the bias (potential difference) and the trigger current between the anode and the gate of light-emitting thyristor 210-2, thereby turning on light-emitting thyristor 210-2 to emit light.

Most of the light emission of light-emitting thyristor 210-2 is due to the current flow between the anode and the cathode, and thus the voltage between the anode and the cathode needs to be reduced to zero to turn off the turned-on light-emitting thyristor 210-2. Because of this, digital signals D7 to D0 are driven to the hexadecimal value (the current instruction value) "00" at time t9, and then the current instruction value (hexadecimal "00") is latched into DAC 300 when serial clock SCK is driven to low at time t10. This turns the current value of the anode driving signal output from output terminal Iout of DAC 300 to zero and thus turns off light-emitting thyristor 210-2.

As described above, at each of the rising edge of pulses 1, 2, 3, 4, 5, 6, 7, and 8 of serial clock SCK shown in FIG. 11, and the output signals from output terminals Q1, Q2, Q3, Q4, Q5, Q6, Q7, and Q8 of shift register 101 go to the low level in turn, one at a time, with the other remaining the high level. Accordingly, when digital signals D7 to D0 is not zero, whichever one of light-emitting thyristors 210-1 to 210-8 connected to output terminals Q1 to Q8 of shift register 101 receiving a low shift register output turns on and emits light. When digital signals D7 to D0 are zero, all light-emitting thyristors 210-1 to 210-8 are turned off.

Note that, applying the potential difference between the anode and the gate of light-emitting thyristor 210 in the forward direction turns on light-emitting thyristor 210, while maintaining the forward potential difference less than the threshold of the forward potential difference is enough to keep light-emitting thyristor 210 off. Thus, in order to keep light-emitting thyristor 210 off, the forward potential difference may be controlled to zero or a reverse potential difference may be applied.

The current in light-emitting thyristor 210 (210-1 to 210-8) mainly flows between the anode and the cathode but does not flow much through the gate to control light-emitting thyristor 210 (210-1 to 210-8) to turn on and off. Accordingly, output terminal Q1 to Q8 or the like of shift register 101 do not need to have large current driving capabilities.

Therefore, the driving elements in shift register 101 can be minimized in size and thus the chip having shift register 101 can be downsized, thereby greatly reducing the manufacturing cost.

Further, in the modification, the driving current value of each light-emitting thyristor 210 is adjustable in 255 levels. Therefore, even through light-emitting thyristors 210 have different light efficiencies, lighting powers (light intensity) of light-emitting thyristors 210 can be adjusted to a predetermined value by changing the driving current values for light-emitting thyristors 210 one by one in turn.

That is, even if the light efficiencies of light-emitting thyristors 210-1 to 210-8 very from each other due to their production variation, any light-emitting thyristors 210 need not be discarded as defective. Therefore, the modification greatly improves the manufacturing yield of light-emitting thyristor 210 and greatly reduces the cost.

In addition to the above described light intensity adjustment, the modification can achieve continuous control by changing the size for each of the dots of the latent image on photosensitive drum 11 to change the size for each of the dots of the toner image by adjusting the anode driving signal for each of light-emitting thyristors 210-1 to 210-8. Therefore, the modification achieves a beautiful continuous tone photo quality print images.

Effect of First Embodiment

Optical print head 13 and image forming apparatus 1 using the semiconductor composite device of the first embodiment achieve the following effects.

In a conventional art, a semiconductor composite device is manufactured by: preparing a silicon wafer wherein circuit elements of a shift register are formed and first metal wires are formed by a photo-lithography method to electrically connect the circuit elements of the shift register in the silicon wafer; attaching a light-emitting thyristor array onto the silicon wafer; and then forming second metal wires to electrically connect output terminals of the shift register to gates of the light-emitting thyristor array. Accordingly, two metal wiring steps are needed to manufacture the semiconductor composite device, and this increases the manufacturing cost.

To solve this problem, the first embodiment has the above described configuration. Accordingly, in the wiring step for connecting the terminals of light-emitting thyristor array 200 and the terminals of shift register 101, the elements of the shift register can also be connected so that the formation of the shift register is completed. This simplifies the manufacturing process and greatly reduces the manufacturing cost.

Further, according to the first embodiment and its modification, since image forming apparatus 1 includes optical print head 13 having the semiconductor composite device chip, image forming apparatus 1 (a printer, a copy machine, a facsimile machine, multifunction peripheries, or the like) achieves high space-efficiency and high light-emission-efficiency.

Such effect is obtained in a black and white image forming apparatus and a multi-color image forming apparatus as well as full-color image forming apparatus 1 described above, however, such effects are more effective on the full-color image forming apparatus requiring more optical print heads 13

Second Embodiment

In the second embodiment of the invention, the outline configuration of image forming apparatus 1 and optical print head 13 is the same as those of the first embodiment, but the configuration and the method of manufacturing the semiconductor composite device chip are different from those of the first embodiment. The differences from the first embodiment are described below.

Figures 1, 12:
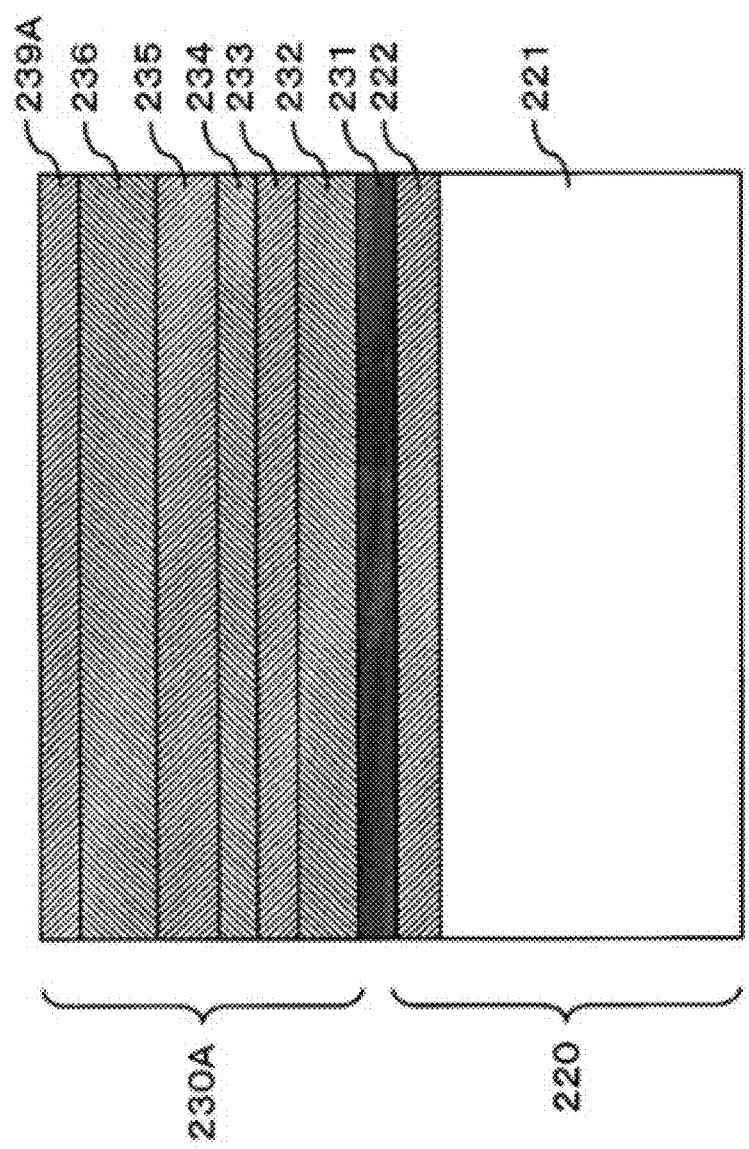
Figures 2, 12:
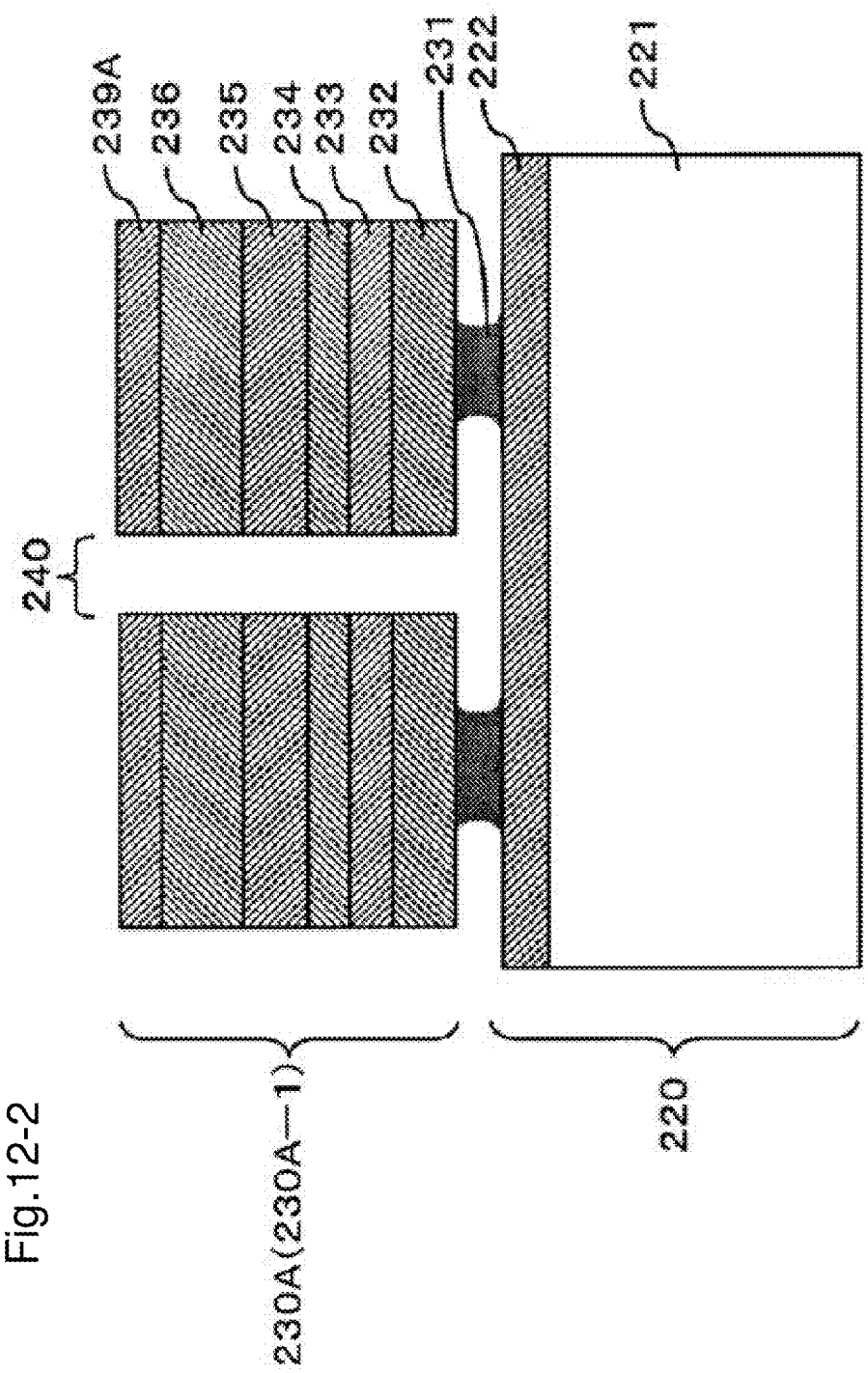
Figures 3, 12:
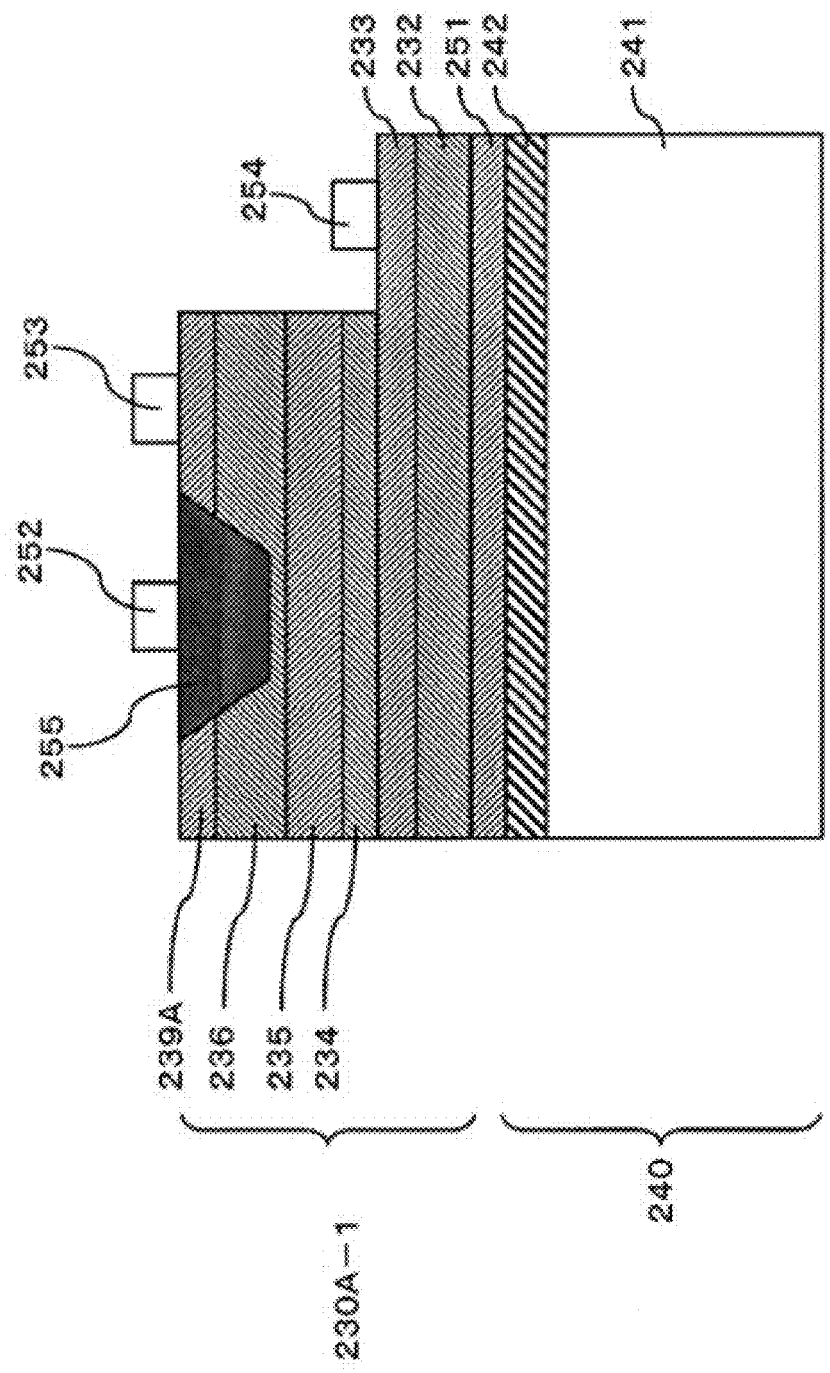

Method of Manufacturing Epi File 230a-1 (See FIGS. 12-1 and 12-2)

FIGS. 12-1 and 12-2 are sectional views schematically illustrating the method of manufacturing epi film 230A-1 for diffusion type light-emitting thyristor 210A. In FIGS. 12-1 and 12-2, the same configurations as in FIGS. 7-1 and 7-2 of the first embodiment are designated by the same reference numerals.

As shown in FIG. 12-1, in the method of manufacturing epi film 230A-1 for diffusion type light-emitting thyristor 210A according to the second embodiment, like the first embodiment, epitaxial layer 230A which is different from epitaxial layer 230 of the first embodiment is formed on base member 220.

In epitaxial layer 230A, n-type GaAs contact layer 239A is formed on n-type AlGaAs layer 236 to replace a set of InGaP etch-stop layer 237, p-type AlGaAs layer 238, and p-type GaAs contact layer 239 of the first embodiment.

Next, like the first embodiment, AlAs delamination layer 222 is removed as shown in FIG. 12-2, and then epi films 230A-1 is obtained by delaminating epitaxial layer 230A from base member 220.

The obtained epi film 230A-1 has such a structure that n-type AlGaAs layer 232, n-type GaAs contact layer 233, InGaP etch-stop layer 234, p-type AlGaAs layer 235, n-type AlGaAs layer 236, and n-type GaAs contact layer 239A are layered in this order.

(Structure of Semiconductor Composite Device of Second Embodiment and Method of Manufacturing the Same)

The semiconductor composite device is manufactured by the following steps (1) to (2), for example.

(1) Step in FIGS. 12-3

FIG. 12-3 is a sectional view schematically illustrating the method of manufacturing the semiconductor composite device. In FIG. 12-3, the same configurations as in FIG. 7-3 are designated by the same reference numerals.

First, IC wafer 240 is prepared (see step S11 shown in FIG. 14). IC wafer 240 is formed by providing passivation film 242 serving as a protection film on silicon substrate 241 wherein unillustrated transistors (see FIG. 7-4A), which are part of shift register 101, are previously formed, and further providing adhesive layer 251a planarizing film made of a material such as polyimide on passivation film 242.

Next, epi film 230A-1 is attached on adhesive layer of IC wafer 240 (see, step S2 in FIG. 8).

Next, p-type impurity diffusion region 255 is formed at a part of n-type GaAs contact layer 239A and n-type AlGaAs layer 236, by diffusing a p-type impurity such as Zn into epi film 230A-1 from the top of n-type GaAs contact layer 239A by solid-phase diffusion.

Note that such impurity diffusion needs a high temperature process; however, metal wires made of a low heat-resistant material such as Aluminum do not exist in IC wafer 240 shown in FIG. 12-3 when the impurity diffusion is executed and thus IC wafer 240 is not damaged by the high temperature process.

Next, a metal electrode is formed on n-type GaAs contact layer (cathode region) 233 to be cathode 254 of light-emitting thyristor 210A, a metal electrode is formed on n-type GaAs contact layer (gate region) 239A to be gate 253 of light-emitting thyristor 210A, and a metal electrode is formed on p-type impurity diffusion region (anode region) 255 to be anode 252 of light-emitting thyristor 210A.

Note that anode 252, gate 253, and cathode 254, which are the metal electrodes, may be formed separately in different steps in this embodiment, but it is preferable that anode 252, gate 253, and cathode 254 are formed at the same time in one step in such a manner that they do not intersect with each other on the same plane.

Next, epi film 230A-1 is covered with an insulating film (not shown) having openings (not show) at predetermined positions exposing anode 252, gate 253, and cathode 254.

With the above described steps, the formation of the light-emitting thyristor array 200 including diffusion type light-emitting thyristors 210A on IC wafer 240 is completed.

Note that the material of epi film 230A-1 is a compound semiconductor crystal made of AlGaAs in this embodiment, other materials such as AlGaInP, GaN, AlGaN, InGaN, or the like may be used as the material of epi film 230A-1.

Note that although light-emitting thyristor 210A is described as homo-junction light-emitting thyristor 210A for simplifying the drawings, light-emitting thyristor 210A may be a single-hetero light-emitting thyristor as epitaxial layer 230A having a PNPN juncture structure wherein plural epitaxial layers are layered in a single-hetero fashion, a double-hetero light-emitting thyristor as epitaxial layer 230A having a PNPN juncture structure wherein plural epitaxial layers are layered in a double-hetero fashion, a distributed bragg reflection (hereinafter, referred to as "DBR") light-emitting thyristor wherein plural gradient index layers are formed, or the like.

FIGS. 12-4A and 12-4B are plan views schematically illustrating the semiconductor composite device chip shown in FIG. 12-3, before a metal wiring step which is described later is executed. FIG. 12-4A is a plan view of the semiconductor composite device chip of FIG. 7-3, and FIG. 12-48 is a plan view illustrating a NMOS and a PMOS shown in FIG. 7-4A.

In FIGS. 12-4A and 12-4B, the same configurations as in FIGS. 7-4A and 7-48 are designated by the same reference numerals.

Near epi film 230A-1 in silicon substrate 241, PMOSs 111 and 112 and unillustrated PMOSs and NMOSs 113 and 114 and unillustrated NMOSs, which are to be part of FFs 110-1 to 110-8 of shift register 101 shown in FIG. 6, are formed like in the first embodiment. FIG. 7-4 illustrates the circuit diagram using circuit symbols for simplifying the drawing.

Note that MOSs 111 and 113 of FIG. 12-4B have the same configuration as in FIG. 7-48 of the first embodiment and are manufactured in the same way as those of the first embodiment.

Figure 13:
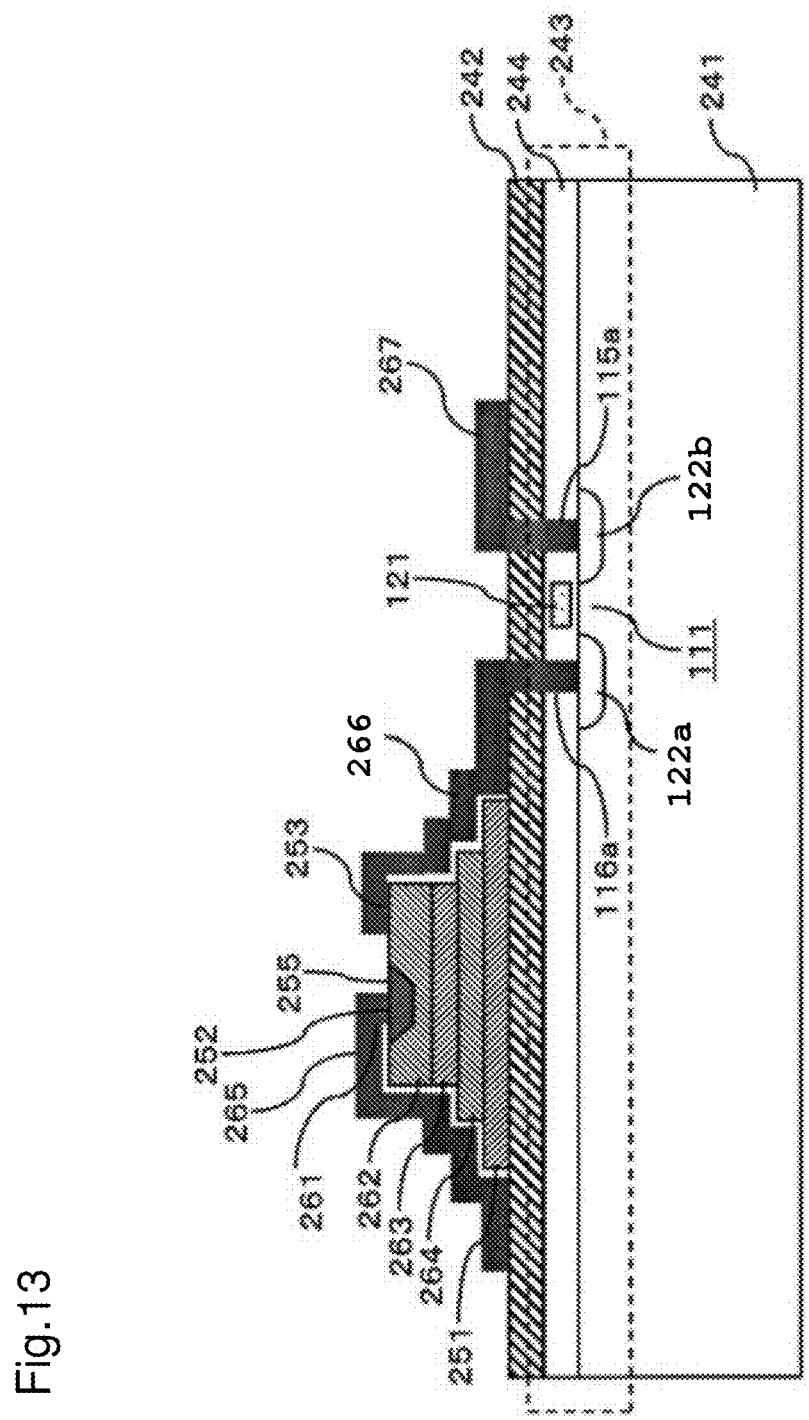
FIG. 13 is an outline sectional view illustrating the wiring structure of the semiconductor composite device according to the second embodiment.

(2) Wiring Step (See FIG. 13)

After the above steps (that is, steps S11 to S14 in FIG. 14), metal wiring step (see step S15 in FIG. 14) is executed. FIG. 13 is an outline sectional view illustrating the wiring structure of the semiconductor composite device according to the second embodiment. In FIG. 13, the same configurations as in FIG. 1 of the first embodiment are designated by the same reference numerals.

Note that n-type AlGaAs layer (cathode layer) 264 in FIG. 13 corresponds to n-type AlGaAs layer 232 in FIG. 12-3, p-type AlGaAs layer 263 in FIG. 13 corresponds to p-type AlGaAs layer 235 in FIG. 12-3, n-type AlGaAs layer (gate layer) 262 in FIG. 13 corresponds to n-type AlGaAs layer 236 in FIG. 12-3, p-type impurity diffusion region (anode region) 255 in FIG. 13 corresponds to p-type impurity diffusion region (anode region) 255 in FIG. 12-3, and contact layers 239A and 233 and etch-stop layer 234 are omitted in FIG. 13 for simplifying the drawing.

In the metal wiring step, anode wire 265 is wired (formed) such that anode wire 265 is connected to anode 252 on p-type impurity diffusion region (anode region) 255, gate wire 266 is wired (formed) such that gate wire 266 is connected to gate 253 on gate layer 262 and connected to drain region 122b of PMOS 111 through drain opening 116a, and wire 267 is wired (formed) such that wire 267 is connected to the power source and the wire 267 is connected through source opening 115a to source region 122a of PMOS 111 which is connected to the ground.

The metal wires such as anode wire 265, gate wire 266, and wire 267 are wired (formed) at the same time after etching the epi film 230A-1 of light-emitting thyristors 210A made of the PNPN layers. For example, the metal wires are formed, by forming a sputtered metallization layer of a metal material such as Aluminum on the entire surface of the wafer and then removing unnecessary portions by photolithography, such that the metal wires not only connect light-emitting thyristors 210 and shift register 101 but also connect the elements of shift register 101 to each other to form shift register 101.

Note that the method of forming the metal wires is not limited to the above description but the metal wires may be formed by well-known lift-off method or the like.

(Outline Process of Manufacturing Semiconductor Composite Device Chip)

FIGS. 14A to 14C are views schematically illustrating the process of manufacturing the diffusion type semiconductor composite device chip, wherein FIG. 14A is a flowchart of the manufacturing process and FIGS. 14b and 14C are sectional views and plan views corresponding to the flow shown FIG. 8A.

According to the manufacturing process for the semiconductor composite device chip of the diffusion type, in step S11, which is a base coating process for IC wafer 240, adhesive layer 251 as a planarizing film is formed at a predetermined portion on the surface of IC wafer 240 after the transistors, which are part of shift register 101 and have not yet been wired, is formed in an upper layer region of IC wafer 240. In step S12, which is an epi film bonding step, epi film 230A-1 previously formed is attached on adhesive layer 251 of IC wafer 240. Note that the top layer of epi file 230A-1 bonded on IC wafer 240 is a n-type semiconductor layer (n-type AlGaAs layer 262 shown in FIG. 13) and will be the gate layer of light-emitting thyristor 210A.

In step S13, which is an anode diffusion step for forming an anode, a p-type impurity such as Zn is diffused into a part of epi film 230A-1 to form p-type impurity diffusion region 255, and anode 252 of light-emitting thyristor 210A is formed on p-type impurity diffusion region 255. With this, an region (non-diffusion region) other than p-type impurity diffusion region 255 of the top layer (n-type AlGaAs layer 262 shown in FIG. 13) of epi film 230A-1 remains unchanged as a n-type semiconductor and is to be gate 253 of light-emitting thyristor 210A. In step S14, which is an etching process for forming a cathode, cathode 254 is formed. After that, in step S15, which is a metal wiring step, anode wire 265 and gate wire 266 for light-emitting thyristor 210A, and wire 267 for shift register 101 are formed thereby obtaining the semiconductor composite device chip.

According to the manufacturing method of the second embodiment (see FIGS. 14B and 14C), unlike the manufacturing method of the first embodiment ((see FIGS. 8B and 8C), after attachment of epi film 230A-1 on IC wafer 240 (step S12) and before metal wires 265 to 267 are formed (step S15), the impurity such as Zn is diffused to form anode 254 of light-emitting thyristor 210A. Therefore, the second embodiment prevents the metal wires 265 to 267 from being damaged by the unavoidable high-temperature process in the diffusion process. The second embodiment can increase the density of the impurity and this improves the light emission efficiency of light-emitting thyristor 210A.

Operation of Second Embodiment

Optical print head 13 according to the second embodiment operates in a similar way to the time chart of FIG. 9 of the first embodiment.

Effects of Second Embodiment

Optical print head 13 and image forming apparatus 1 having the above described semiconductor composite device according to the second embodiment achieve the following effects.

In a conventional art, a semiconductor composite device is manufactured by: preparing a silicon wafer wherein circuit elements of a shift register are formed; forming first metal wires by a photo-lithography method to electrically connect the circuit elements of the shift register formed in the silicon wafer; attaching a light-emitting thyristor array onto the silicon wafer; and then forming second metal wires to electrically connect output terminals of the shift register to gates of the light-emitting thyristor array.

Accordingly, two metal wire wiring steps are needed to manufacture the semiconductor composite device according to the conventional art, and this increases the manufacturing cost.

In the case where the first metal wires for the shift register, which may be a thin film mainly made of aluminum, do not have high heat-resistance, it is difficult to execute a high-temperature process such as an impurity diffusion process, after the epi-file is attached on the wafer.

To solve this problem, the second embodiment employs the above configuration. Accordingly, the second embodiment can concurrently execute the step of electrically connecting the circuit elements of the shift register to each other so as to form the shift register and the step of electrically connecting the terminals of light-emitting thyristor array 200 and terminals of shift register 101. This simplifies the manufacturing process and greatly reduces the manufacturing cost.

Further, in the second embodiment, after attaching epi film 230A-1 onto IC wafer 240, the anode region of light-emitting thyristor 210A is formed by selectively diffusing the impurity such as Zn at a high density. Accordingly, the density of the impurity increases and this improves the light emission efficiency of light-emitting thyristor 210A.

Since the impurity such as Zn is selectively diffused in the second embodiment, the position of the impurity diffusion can easily be selected. This improves the position accuracy of the impurity diffusion region and decreases the size of the impurity diffusion region accordingly. Therefore, the second embodiment realizes the array pitch of light-emitting thyristors 210A that can be shortened and this brings about precision miniature optical print head 13.

Further, according to the second embodiment, since image forming apparatus 1 adopts optical print head 13 having the composite chips, image forming apparatus 1 of the second embodiment realizes the same effect as the first embodiment.

(Other Modifications)

The invention is not limited to the above embodiments and modifications but should include other medications such as the following examples (a) to (c).

(a) The above embodiments use light-emitting thyristor 210 or 210A (a light-emitting element) as a driven element, but the invention is not limited to this so that other driven elements such as a LED, an organic EL, or the like can be used in the invention. That is, the invention can be adapted to a printer having print head 13 that comprises an array of organic ELs, and also can be adopted to drive a row or matrix of display elements or picture elements.

(b) The invention can be applied to drive not only a three-terminal element such as light-emitting thyristor 210 or 210A but also a two-terminal driven element such as a LED or a four-terminal element such as a four-terminal thyristor with first and second gates (Silicon Semiconductor Controlled Switch).

(c) The invention can be applied to not only driver IC 100 wherein the same driven elements 210 or 210A are sequentially-positioned but also to an IC chip having one or more driving terminal outputs or a device equipped with the IC chip.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A semiconductor composite device comprising:
   a substrate comprising circuit elements, which are part of a driving circuit;
   an insulating film provided on the substrate;
   an array of driven elements provided on the insulating film on the substrate, the array being formed of a semiconductor thin film having a crystal structure wherein the driven elements are arrayed to be driven by the driving circuit;
   a first line electrically connecting the circuit elements to each other such that the first line and the circuit elements form the driving circuit; and
   a second line electrically connecting the driving circuit and the driven elements,
   wherein the first line and the second line are formed on the insulating film.

2. The semiconductor composite device according to claim 1, further comprising:
   an impurity diffusion region in the semiconductor thin film, the impurity diffusion region being a part of the driven elements.

3. The semiconductor composite device according to claim 1, wherein
   the driven elements are switching elements.

4. The semiconductor composite device according to claim 3, wherein
   the switching elements are light-emitting elements configured to emit light in response to an electric signal.

5. The semiconductor composite device according to claim 4, wherein
   the switching elements are light-emitting thyristors.

6. The semiconductor composite device according to claim 5, wherein
   the light-emitting thyristors have a PNPN structure or a PNPNPN structure.

7. The semiconductor composite device according to claim 1, wherein
   the driving circuit is a shift register configured to drive the driven elements in a time sharing method.

8. The semiconductor composite device according to claim 7, wherein
   the circuit elements are a group of transistors, which are part of the shift register.

9. An optical print head comprising:
   the semiconductor composite device according to claim 4; and
   a lens array configured to refract light emitted from the light-emitting elements of the semiconductor composite device.

10. An image forming apparatus comprising:
    the optical print head according to claim 9.

11. An image forming apparatus comprising:
    a photosensitive body,
    the optical print head according to claim 9, the optical print head configured to emit light onto the photosensitive body to form a latent image on the photosensitive body;
    a developing device configured to develop the latent image with a developer to form a developer image;
    a transfer device configured to transfer the developer image to a medium; and
    a fixing device configured to fix the developer image to the medium.

12. A method of manufacturing a semiconductor composite device, comprising steps of:
- preparing a substrate comprising circuit elements, which are part of a driving circuit;
- forming an insulating film on the substrate;
- attaching an array of driven elements onto the insulating film, the array being formed of a semiconductor thin film having a crystal structure wherein the driven elements are arrayed to be driven by the driving circuit; and
- forming a first metal wire and a second metal wire on the insulating film by a photo-lithography method such that the circuit elements are electrically connected with the first metal wire to form the driving circuit and the driving circuit is electrically connected to the driven elements with the second metal wire.

13. A method of manufacturing a semiconductor composite device, comprising steps of:
- preparing a substrate comprising circuit elements, which are part of a driving circuit;
- forming an insulating film on the substrate;
- attaching an array of driven elements onto the insulating film, the array being formed of a semiconductor thin film having a crystal structure wherein the driven elements are arrayed to be driven by the driving circuit;
- forming an impurity diffusion region in the semiconductor thin film by diffusing an impurity into the semiconductor thin film, the impurity diffusion region being a part of the driven element; and
- forming a first metal wire and a second metal wire on the insulating film by a photo-lithography method such that the circuit elements are electrically connected with the first metal wire to form the driving circuit and the driving circuit is electrically connected to the driven elements with the second metal wire.

14. The method according to claim 12, further comprising:
- forming a support member to support and protect the semiconductor thin film.

15. The method according to claim 13, further comprising:
- forming a support member to support and protect the semiconductor thin film.

16. The semiconductor composite device according to claim 2, wherein the impurity in the impurity diffusion region comprises Zn.

17. The method according to claim 13, wherein the impurity in the impurity diffusion region comprises Zn.

18. The semiconductor composite device according to claim 1, wherein the semiconductor thin film includes edges that are sloped.

19. The method according to claim 12, wherein the array is formed of the semiconductor thin film having the crystal structure with sloped edges.

20. The method according to claim 13, wherein the array is formed of the semiconductor thin film having the crystal structure with sloped edges.

* * * * *